United States Patent
Chiba et al.

(10) Patent No.: US 7,038,520 B2
(45) Date of Patent: May 2, 2006

(54) TIMING SIGNAL GENERATING CIRCUIT AND RECEIVER CIRCUIT DESIGNED TO SPEED UP SIGNAL TRANSMISSION

(75) Inventors: Takaya Chiba, Kawasaki (JP); Hirotaka Tamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 146 days.

(21) Appl. No.: 10/721,911

(22) Filed: Nov. 26, 2003

(65) Prior Publication Data

US 2004/0145401 A1    Jul. 29, 2004

(30) Foreign Application Priority Data

Jan. 29, 2003    (JP)    ............... 2003-020817

(51) Int. Cl.
    *G06F 1/04*    (2006.01)
(52) U.S. Cl. .................. 327/333; 327/298; 326/30; 326/86
(58) Field of Classification Search ........ 327/156–158, 327/231, 256, 257, 291, 298, 333, 108, 258; 326/30, 86
    See application file for complete search history.

(56) References Cited

U.S. PATENT DOCUMENTS

| 5,614,855 | A | * | 3/1997 | Lee et al. .................. 327/158 |
| 6,111,445 | A | * | 8/2000 | Zerbe et al. ................ 327/231 |
| 2002/0172304 | A1 | | 11/2002 | Takuya et al. |
| 2003/0146780 | A1 | | 8/2003 | Takaya et al. |

FOREIGN PATENT DOCUMENTS

| JP | 2002-314516 | 10/2002 |
| JP | 2003-229763 | 8/2003 |

* cited by examiner

*Primary Examiner*—Dinh T. Le
(74) *Attorney, Agent, or Firm*—Arent Fox PLLC

(57) ABSTRACT

A timing signal generating circuit receives a plurality of input signals of differing phases and generates a timing signal having a phase intermediate therebetween. The timing signal generating circuit has a plurality of current polarity switching circuits, and a voltage level correction circuit. Each of the current polarity switching circuits is provided between a plurality of current sources and acts to switch an output current polarity in accordance with a corresponding one of the input signals. The voltage level correction circuit corrects the voltage level of a phase-combined signal produced by combining weighted outputs of the plurality of current polarity switching circuits.

26 Claims, 31 Drawing Sheets

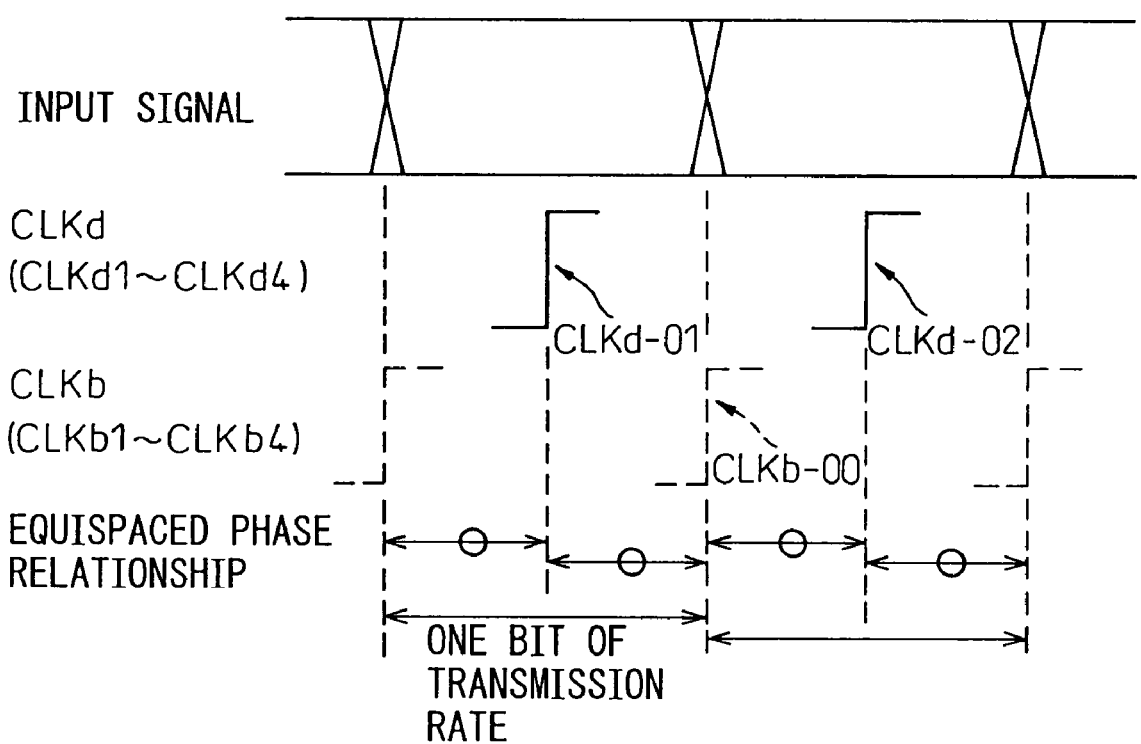

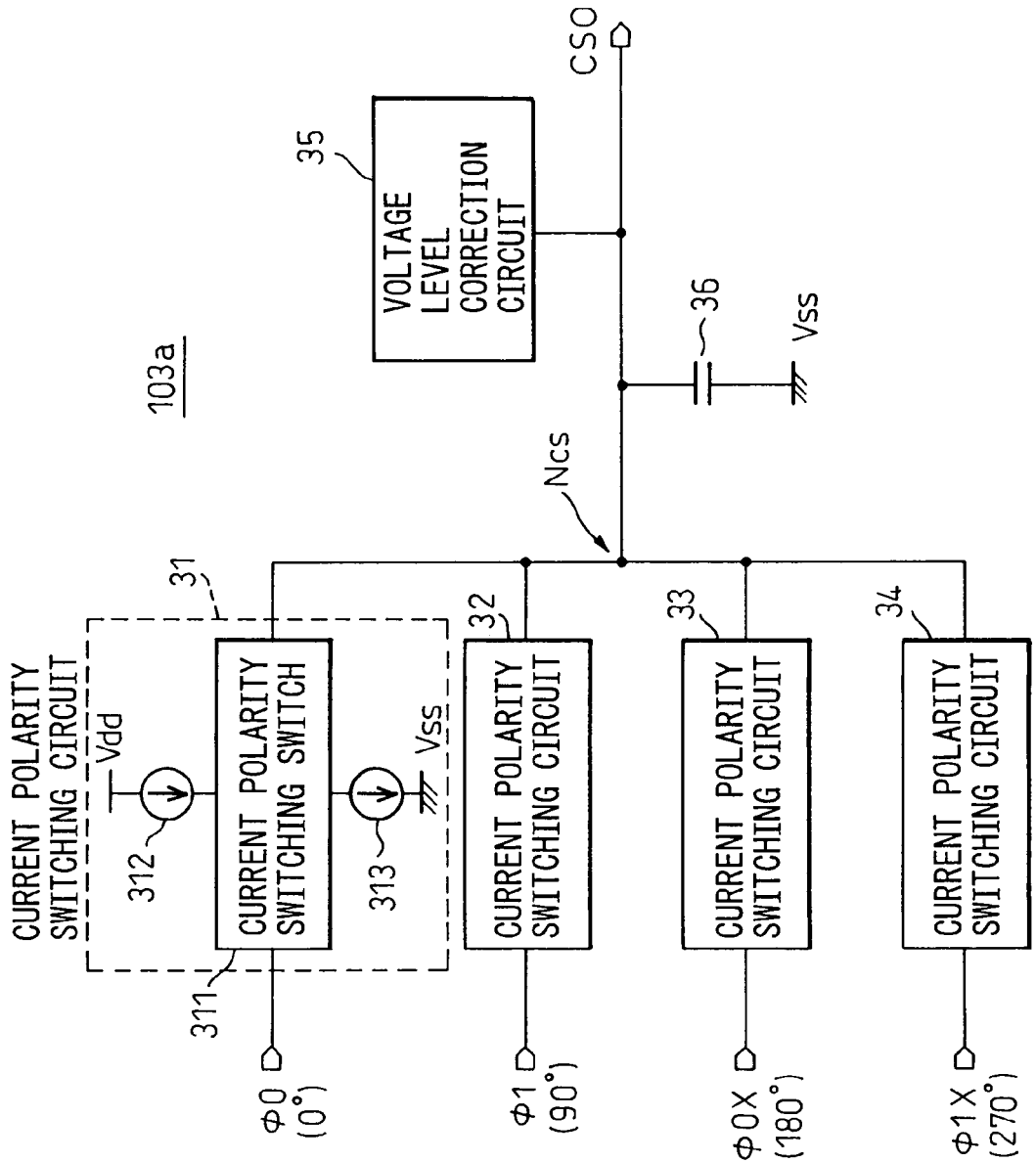

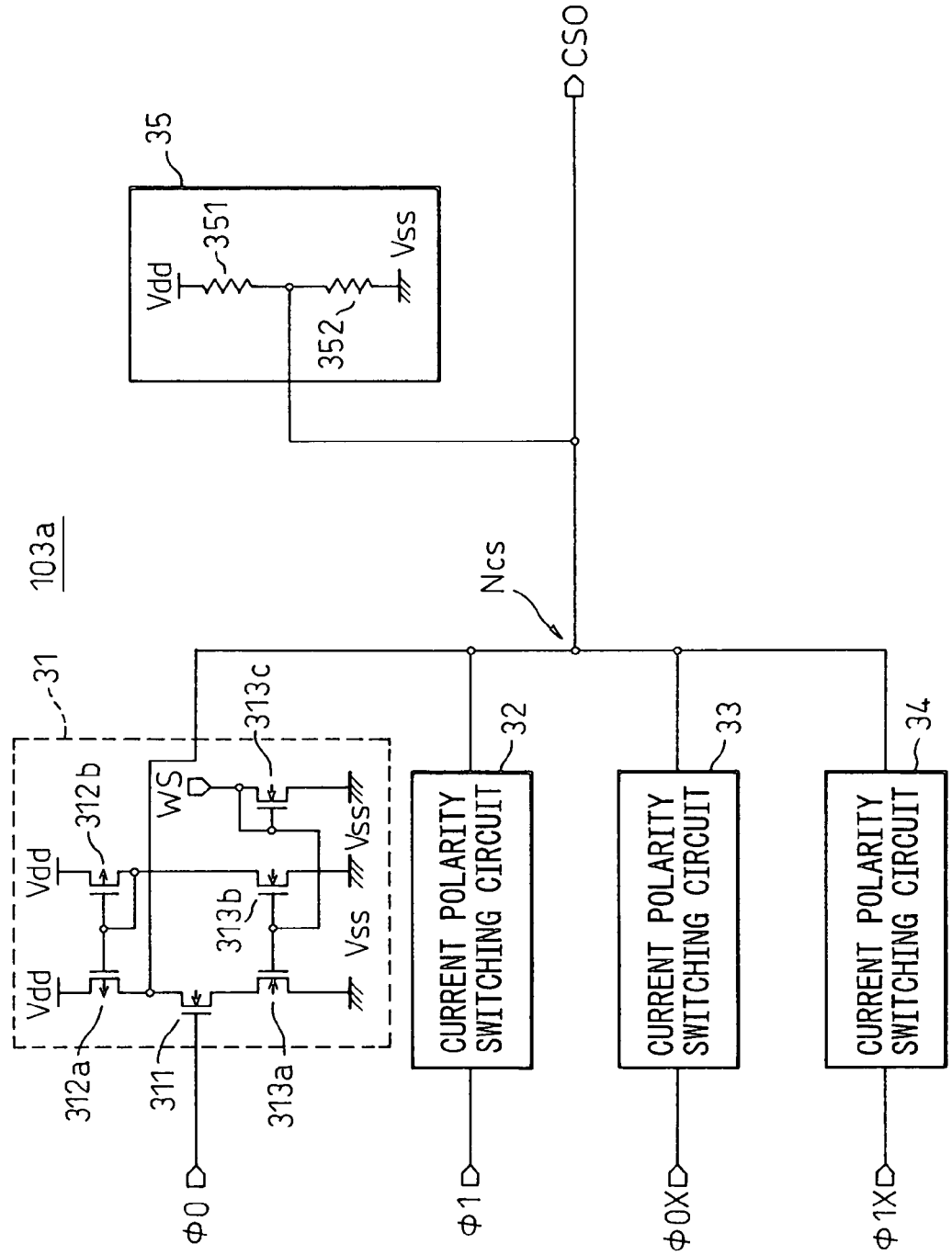

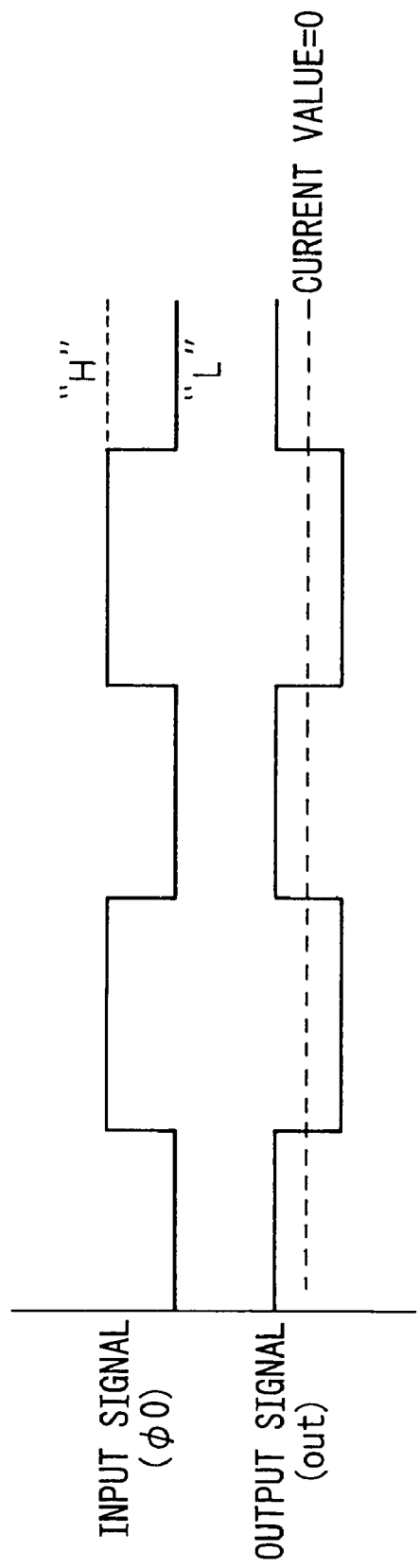

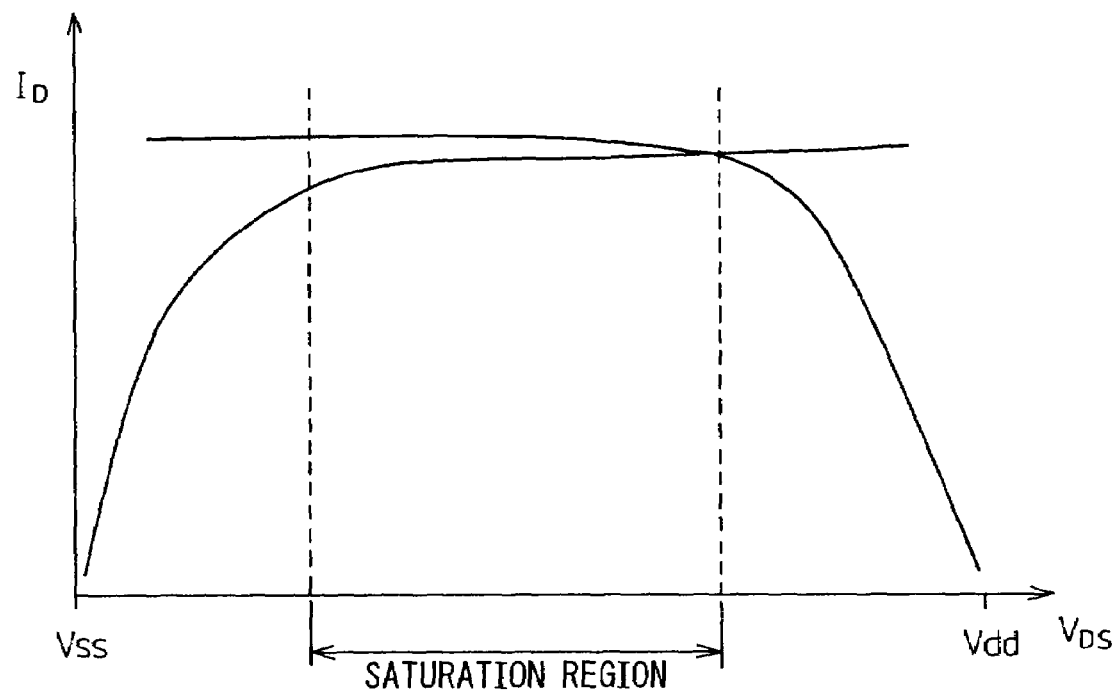

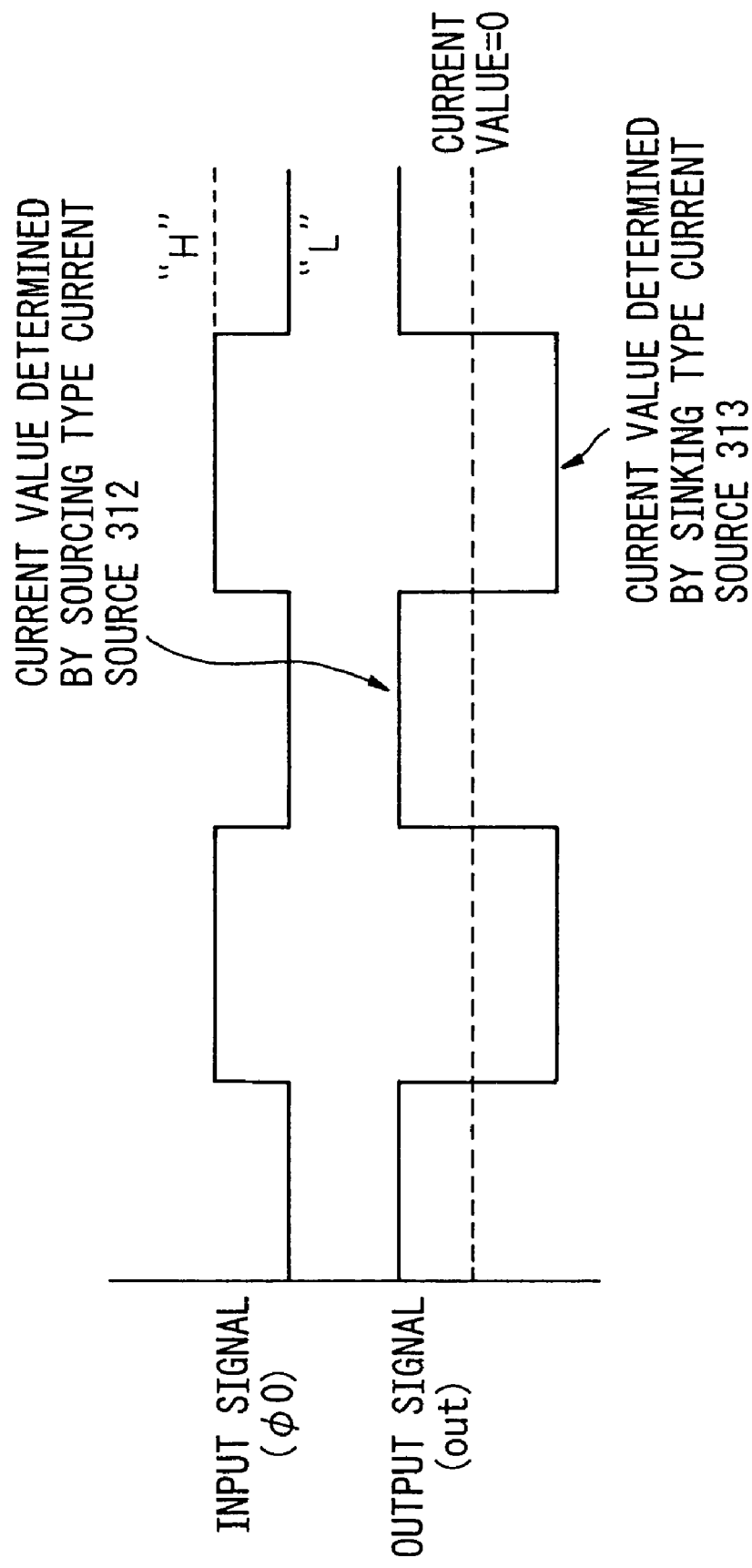

[DC CHARACTERISTICS OF AMPLIFIER]

TIMING SIGNAL GENERATING CIRCUIT AND RECEIVER CIRCUIT DESIGNED TO SPEED UP SIGNAL TRANSMISSION

CROSS REFERENCE TO RELATED APPLICATION

This application is based upon and claims the benefit of priority from the prior Japanese Patent Application No. 2003-020817, filed on Jan. 29, 2003, the entire contents of which are incorporated herein by reference.

BACKGROUND OF THE INVENTION

1. Field of the Invention

The present invention relates to a timing signal generating circuit which performs phase interpolation and a receiver circuit having such a timing signal generating circuit and, more particularly, to a timing signal generating circuit designed to speed up signal transmission between a plurality of LSIs or a plurality of devices or circuit blocks within a single chip, or between a plurality of boards or a plurality of cabinets.

2. Description of the Related Art

Recently, the performance of components used in computers and other information processing apparatuses has been greatly improved. In particular, dramatic improvements have been made, for example, in the performance of processors and semiconductor memory devices such as DRAMs (Dynamic Random Access Memories). The improvements in the performance of semiconductor memory devices, processors, and the like have come to the point where system performance cannot be improved further unless the speed of signal transmission between components or elements is increased.

Specifically, the speed of signal transmission between a main storage device such as a DRAM and a processor (i.e., between LSIs), for example, is becoming a bottleneck impeding performance improvement for a computer as a whole. Furthermore, the need for the improvement of signal transmission speed is increasing not only for signal transmission between cabinets or boards (printed wiring boards), such as between a server and a main storage device or between servers connected via a network, but also for signal transmission between chips or between devices or circuit blocks within a chip because of increasing integration and increasing size of semiconductor chips.

There is therefore a need to provide a timing signal generating circuit that can generate, with simple circuitry and with high accuracy, a plurality of timing signals having a prescribed phase difference synchronously with a reference clock.

To speed up signal transmission between LSIs, it is required that the receiver circuit operates (detects and discriminates data) with accurate timing with respect to an incoming signal. In the prior art, it is known to provide in a signal receiver circuit a clock recovery circuit that uses a feedback loop type clock signal generating circuit (phase adjusting timing signal generating circuit) in order to generate a clock (internal clock) of such accurate timing. Here, the value of a phase adjusting weight for clock recovery is generated using, for example, a phase comparator circuit which compares the phase of an external input clock with that of the internal clock (refer, for example, to Japanese Patent Application No. 2002-25724 (corresponding to U.S. Patent Application Publication No. US2003/0146780 A1) and Japanese Unexamined Patent Publication (Kokai) No. 2002-314516) (corresponding to U.S. Patent Application Publication No. US2002/0172304 A1).

The prior art and its associated problem will be described in detail later with reference to relevant drawings.

SUMMARY OF THE INVENTION

An object of the present invention is to provide a timing signal generating circuit that can generate timing signals with high accuracy by using simple circuitry.

According to the present invention, there is provided a timing signal generating circuit which receives a plurality of input signals of differing phases and generates a timing signal having a phase intermediate therebetween, comprising a plurality of current polarity switching circuits, each provided between a plurality of current sources and acting to switch an output current polarity in accordance with a corresponding one of the input signals; and a voltage level correction circuit correcting the voltage level of a phase-combined signal produced by combining weighted outputs of the plurality of current polarity switching circuits.

Further, according to the present invention, there is also provided a receiver circuit comprising a data detection/discrimination circuit detecting and discriminating data carried in an input signal; a changing point detection/discrimination circuit detecting and discriminating a changing point appearing in the input signal; a phase comparator circuit receiving outputs from the data detection/discrimination circuit and the changing point detection/discrimination circuit, and comparing the phases of the outputs; and a clock signal generating circuit receiving an output from the phase comparator circuit, and supplying a first internal clock to the data detection/discrimination circuit and a second internal clock to the changing point detection/discrimination circuit, wherein the clock signal generating circuit is a timing signal generating circuit which receives a plurality of input signals of differing phases and generates a timing signal having a phase intermediate therebetween, comprising a plurality of current polarity switching circuits, each provided between a plurality of current sources and acting to switch an output current polarity in accordance with a corresponding one of the input signals; and a voltage level correction circuit correcting the voltage level of a phase-combined signal produced by combining weighted outputs of the plurality of current polarity switching circuits.

The voltage level correction circuit may be constructed from a negative feedback circuit. The timing signal generating circuit may further comprise an amplifying circuit amplifying the phase-combined signal, and wherein the voltage level correction circuit may correct the voltage level of the phase-combined signal to or near an operation point level of the amplifying circuit.

The amplifying circuit may comprise a plurality of stages of amplifiers in cascade, and the voltage level correction circuit may correct the voltage level for each output of each of the amplifiers. The voltage level correction circuit may detect an output voltage average value of the timing signals, and correct the output voltage average value of the timing signals to or near an operation point level of the amplifier.

The amplifying circuit may comprise a negative feedback type amplifier. The voltage level correction circuit may detect an output voltage average value of the timing signals, and correct the output voltage average value of the timing signals to or near an operation point level of the amplifier.

The timing signal generating circuit may generate differential timing signals, and wherein the voltage level correction circuit may comprise a voltage level monitoring circuit monitoring the voltage level of the differential timing signals; and a center voltage controlling circuit controlling the center voltage of the differential timing signals based on a reference voltage and an output of the voltage level monitoring circuit.

The center voltage controlling circuit may directly control the center voltage of the differential timing signals. The center voltage controlling circuit may control the center voltage of the differential timing signals by adjusting a current in each of the current polarity switching circuits. The center voltage controlling circuit may control the center voltage of the differential timing signals by adjusting a current that flows through a current correction transistor connected in parallel to a current source in each of the current polarity switching circuits.

Each of the current polarity switching circuits may comprise a first current source connected to a first power supply line; a second current source connected to a second power supply line; and a current polarity switching switch, connected between the first and second current sources, switching current polarity. The first power supply line may be a high potential power supply line and the second power supply line may be a low potential power supply line; and the first current source may be a sourcing type current source which sources a current from the high potential power supply line toward the current polarity switching switch, and the second current source may be a sinking type current source which sinks a current from the current polarity switching switch toward the low potential power supply line.

BRIEF DESCRIPTION OF THE DRAWINGS

The present invention will be more clearly understood from the description of the preferred embodiments as set forth below with reference to the accompanying drawings, wherein:

FIG. 5 is a diagram showing signal timings in the receiver circuit;

FIG. 6 is a diagram showing the basic functional configuration of a timing signal generating circuit according to the present invention;

FIG. 7 is a block circuit diagram showing a first embodiment of the timing signal generating circuit according to the present invention;

FIG. 9 is a diagram (part 2) for explaining the operation of the timing signal generating circuit of FIG. 7;

FIG. 10 is a diagram (part 3) for explaining the operation of the timing signal generating circuit of FIG. 7;

FIG. 16 is a diagram (part 2) for explaining the operation of the current polarity switching circuit in the timing signal generating circuit of FIG. 14;

DESCRIPTION OF THE PREFERRED EMBODIMENTS

Before describing in detail the preferred embodiments of a timing signal generating circuit according to the present invention, a prior art timing signal generating circuit and its associated problem will be described below with reference to drawings.

Figure 1:
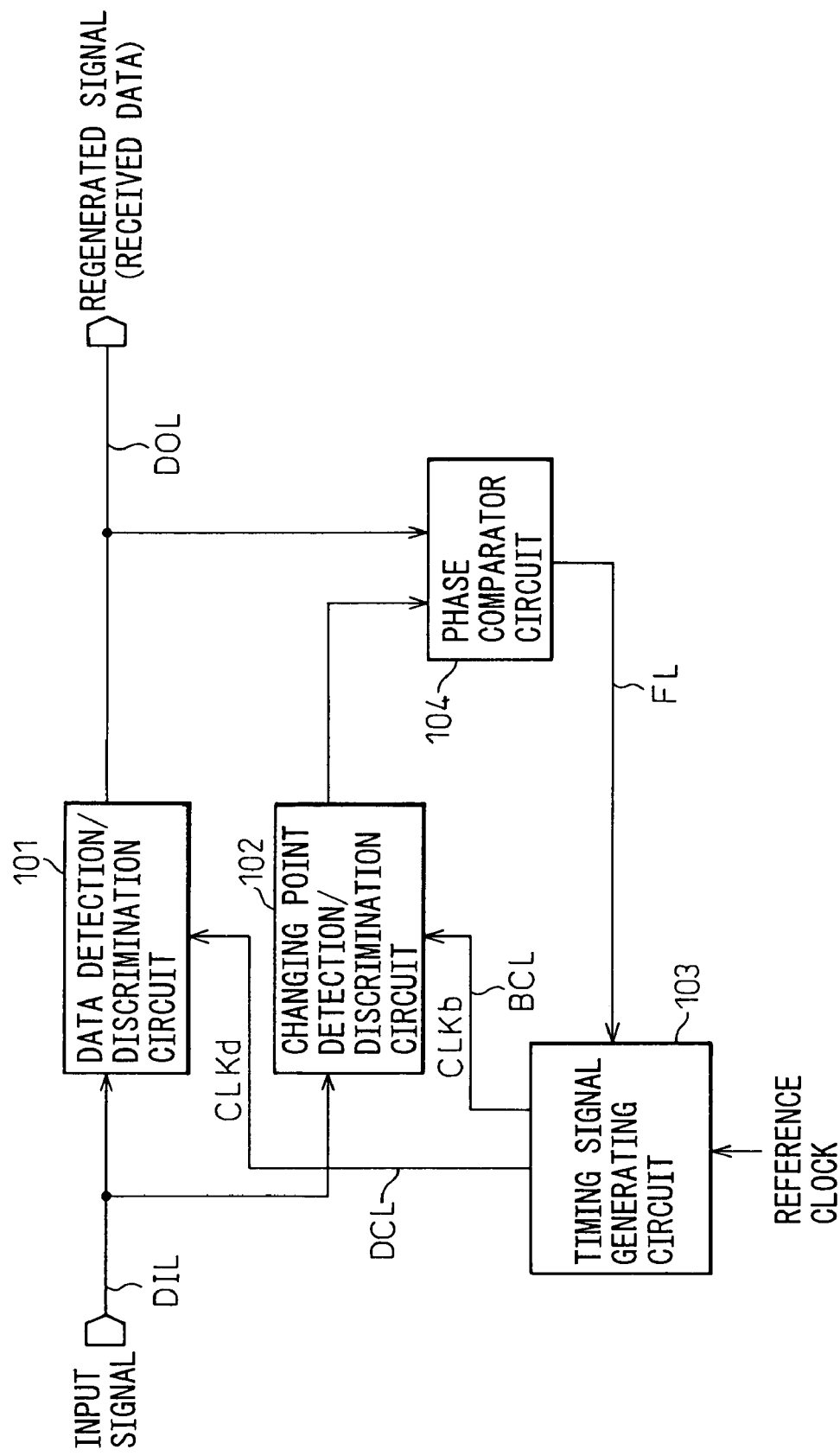
FIG. 1 is a block diagram schematically showing one example of a receiver circuit including a clock recovery circuit.

FIG. 1 is a block diagram schematically showing one example of a receiver circuit including a clock recovery circuit. In FIG. 1, reference numeral 101 is a data detection/discrimination circuit, 102 is a changing point detection/discrimination circuit, 103 is a timing signal generating circuit (a phase adjusting timing signal generating circuit, i.e., a phase interpolator), and 104 is a phase comparator circuit. Further, reference character DIL is a data input line, DOL is a data output line, DCL is a data detection clock line, BCL is a changing point detection clock line, and FL is a feedback line.

As shown in FIG. 1, in the receiver circuit (clock recovery circuit), reference clocks are supplied to the timing signal generating circuit 103 which, by integrating and amplifying the weighted sum of the input reference clocks, generates clocks (CLKd and CLKb) of phases corresponding to the values of the weights (WS), and supplies the data detection clock CLKd to the data detection/discrimination circuit 101 and the changing point detection clock CLKb to the changing point detection/discrimination circuit 102.

Here, the data detection clock CLKd is a timing signal used to regenerate (detect) the input signal, and the changing point detection clock CLKb is a timing signal used to detect a changing point in the input signal. The data detection clock CLKd and the changing point detection clock CLKb are chosen to have such a phase relationship that provides a phase difference of, for example, about 90° between them for one bit of input signal.

The phase comparator circuit 104 compares the outputs of the data detection/discrimination circuit 101 and the changing point detection/discrimination circuit 102, and supplies (feeds back) a feedback signal (control signal) to the timing signal generating circuit 103 via the feedback line FL.

In the operation of the feedback loop, the data detection/discrimination circuit 101 regenerates the input signal based on the data detection clock CLKd supplied from the timing signal generating circuit 103, while the changing point detection/discrimination circuit 102 detects the changing point of the input signal based on the changing point detection clock CLKb supplied from the timing signal generating circuit 103.

The phase comparator circuit 104 compares the output of the data detection/discrimination circuit 101 with the output of the changing point detection/discrimination circuit 102, determines whether the timing signals (data detection clock CLKd and changing point detection clock CLKb) are at the proper phases, and supplies the timing signal generating circuit 103 with a phase control signal indicating whether the phase is to be advanced or delayed. The timing signal generating circuit 103 then corrects the phase based on the phase control signal supplied from the phase comparator circuit 104, and supplies the phase-corrected timing signals (CLKd and CLKb) to the respective detection/discrimination circuits (101 and 102).

By repeating the above sequence of operations, the feedback loop causes the changing point detection clock CLKb (CLKb1 to CLKb4) to settle at or near the changing point of the input signal as shown in FIG. 5 to be described later. In this case, since the data detection clock CLKd (CLKd1 to CLKd4) having a phase difference of 90° for one bit of input data occurs at the center of the input signal, the signal can be regenerated with accurate timing.

To achieve the above feedback loop, a timing signal generating circuit capable of generating the timing signals with high accuracy becomes necessary. In the description herein given, the term "clock recovery circuit" is used by focusing attention on the fact that the data detection clock is recovered from the input signal, while the term "receiver circuit" is used by focusing attention on the fact that the data detection/discrimination circuit, using the recovered clock, detects and discriminates the data carried in the input signal, and outputs the data as the received data.

Figure 2:
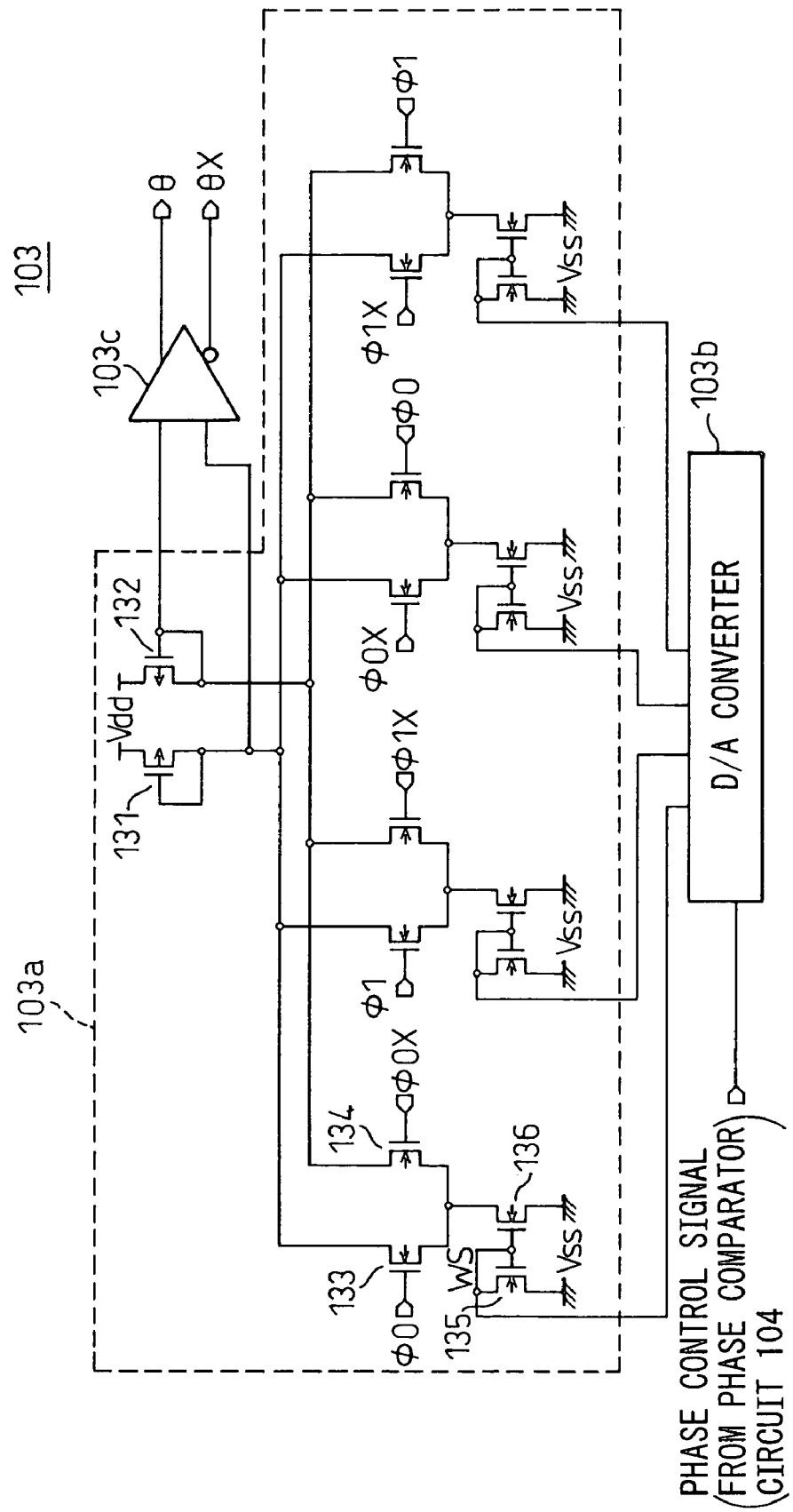
FIG. 2 is a block circuit diagram showing one example of a prior art timing signal generating circuit in the receiver circuit of FIG. 1.
Figure 3:
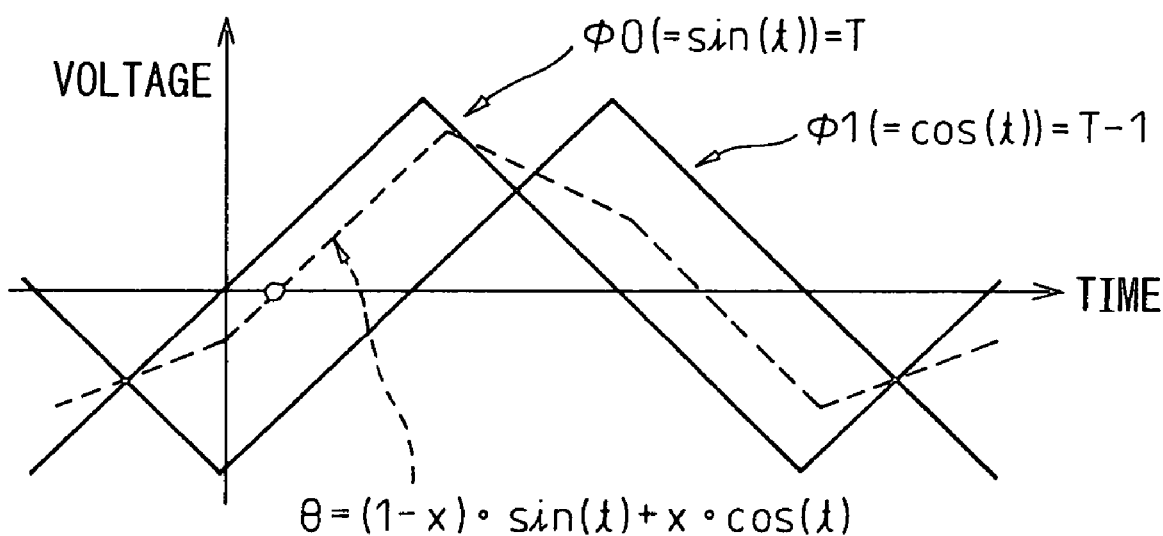
FIG. 3 is a waveform diagram for explaining the operation of the timing signal generating circuit of FIG. 2.

FIG. 2 is a block circuit diagram showing one example of the prior art timing signal generating circuit 103 in the receiver circuit of FIG. 1, and FIG. 3 is a waveform diagram for explaining the operation of the timing signal generating circuit of FIG. 2. In FIG. 2, reference numeral 103a is a phase combining circuit (phase mixer), 103b is a digital-to-analog converter (D/A converter), and 103c is an amplifying circuit.

The phase combining circuit 103a receives, for example, four-phase clocks (reference clocks) $\phi 0$, $\phi 0X$, $\phi 1$, and $\phi 1X$ and the outputs of the D/A converter 103b, applies weights WS (the outputs of the D/A converter 103b) to the respective reference clocks, and thereby outputs through the amplifying circuit 103c a clock $\theta$ ($\theta X$) having a phase intermediate between the respective reference clocks. Here, the four-phase clocks are of the same frequency but differ in phase by 90° relative to each other; that is, the clock $\phi 0$ has a phase difference of 180° relative to the clock $\phi 0X$, and likewise, the clock $\phi 1$ has a phase difference of 180° relative to the clock $\phi 1X$.

More specifically, as shown in FIG. 2, the phase combining circuit 103a comprises: four differential pairs of transistors 133 and 134, to which the four-phase clocks $\phi 0$, $\phi 0X$, $\phi 1$, and $\phi 1X$ are input; load transistors 131 and 132 provided common to all the transistor differential pairs; and a current source transistor 136 (135) which is provided for each transistor differential pair, and which applies a weight by varying the bias current value in accordance with the output of the D/A converter 103b. Here, the bias current source transistor 136 for controlling the current flowing to the differential amplifier (differential-input transistor) is connected in a current-mirror configuration with the transistor 135 whose current is controlled by the output of the D/A converter 103b.

The four-phase clocks $\phi 0$, $\phi 0X$, $\phi 1$, and $\phi 1X$ (two phase differential reference clocks) are respectively weighted and summed together in the phase combining circuit 103a, and thereafter fed to the amplifying circuit 103c to obtain the phase intermediate between the reference clocks. As earlier described, the D/A converter 103b generates the weight signal WS by receiving from the phase comparator circuit 104 the phase control signal based on which to determine whether the phase is to be advanced or delayed.

FIG. 3 is a waveform diagram for explaining the operation of the timing signal generating circuit of FIG. 2, and shows the operating principle of the phase combining circuit 103a.

As shown in FIG. 3, in the timing signal generating circuit of FIG. 2, when $\phi 0 = \sin(t)$ and $\phi 1 = \cos(t)$, if $\phi 0$ and $\phi 1$ are weighted, for example, with (1−x) and (x), respectively, the phase-combined signal (output clock) $\theta$ is given as $\theta = (1-x)\cdot\sin(t) + x\cdot\cos(t)$.

Here, if it is assumed that $\phi 0$ and $\phi 1$ are changing linearly in the vicinity of time=0, then $\phi 0 = T$ and $\phi 1 = T-1$, and thus the output clock $\theta$ is given as $\theta = (1-x)\cdot T + x\cdot(T-1) = T-x$. This indicates that when the amount of weighting, x, is varied linearly, the phase of the output clock $\theta$ also varies linearly. That is, by applying the weights 1−x and x to the reference signals $\phi 0$ and $\phi 1$, the output clock (phase-combined signal)

θ having a phase intermediate between these reference signals φ0 and φ1 can be generated.

Figure 4:
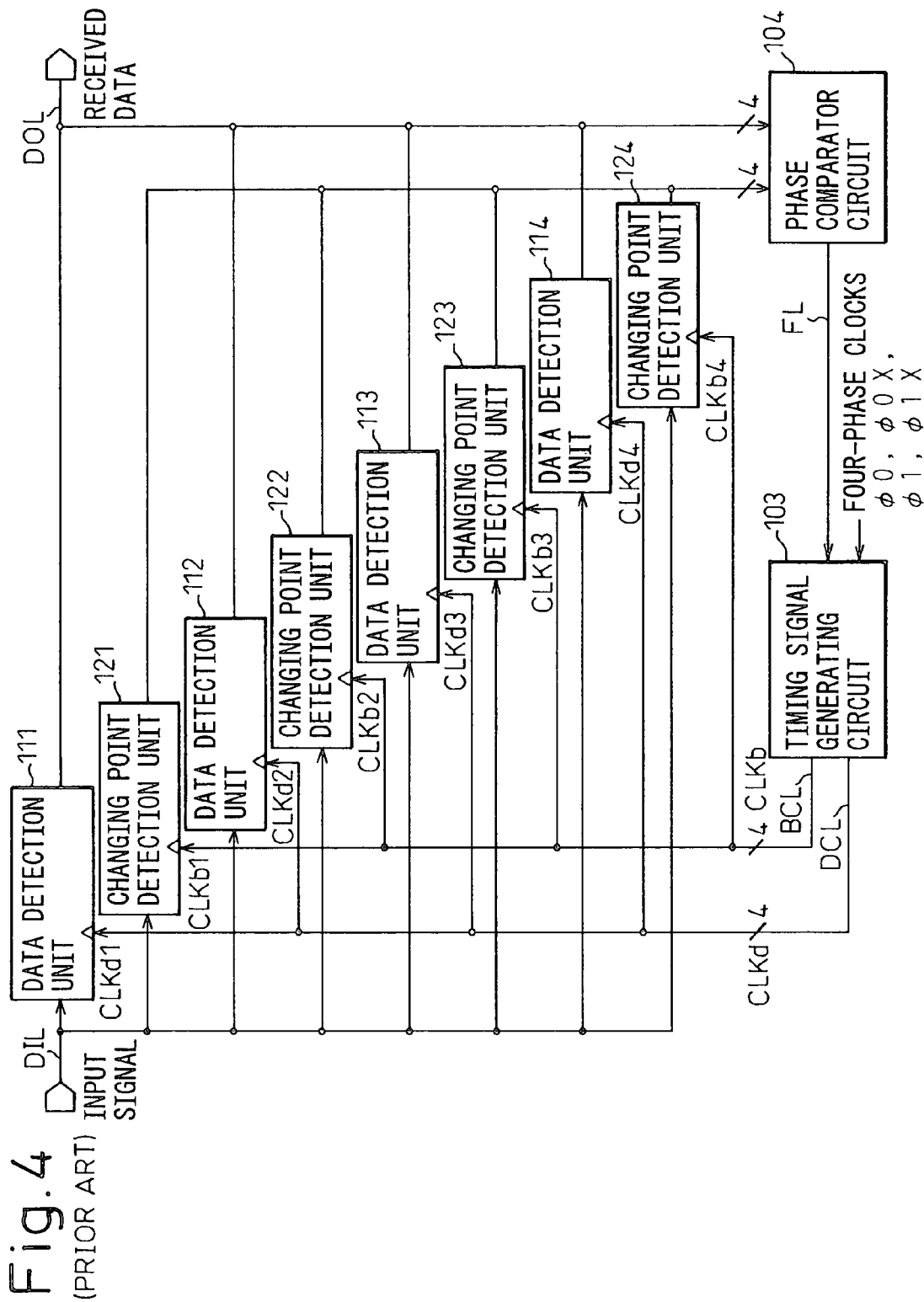
FIG. 4 is a block diagram schematically showing one example of the receiver circuit including the clock recovery circuit.

FIG. 4 is a block diagram schematically showing one example of the receiver circuit including the clock recovery circuit, wherein the circuit is configured as a 4-way×2 type interleaving circuit. In FIG. 4, reference numerals 111 to 114 are data detection units, 121 to 124 are changing point detection units, 103 is the timing signal generating circuit, and 104 is the phase comparator circuit.

As shown in FIG. 4, in the receiver circuit, two pairs of differential clocks (φ0, φ0X; φ1, φ1X) are supplied as four-phase input signals (four-phase clocks) to the timing signal generating circuit 103 which integrates and amplifies the weighted sum of the input signals and generates clocks (CLKd and CLKb) of phases corresponding to the values of the weights.

The clock CLKd consists of four data detection unit control signals CLKd1, CLKd2, CLKd3, and CLKd4 whose phases are, for example, spaced 90 degrees apart relative to each other, and these control signals are supplied to the respective data detection units (data detection/discrimination circuits) 111 to 114.

On the other hand, the clock CLKb consists of four changing point detection unit control signals CLKb1, CLKb2, CLKb3, and CLKb4 whose phases are, for example, spaced 90 degrees apart relative to each other, and these control signals are supplied to the respective changing point detection units (changing point detection/discrimination circuits) 121 to 124. The data detection unit control signals CLKd1, CLKd2, CLKd3, and CLKd4 have a phase difference of 45 degrees relative to the respective changing point detection unit control signals CLKb1, CLKb2, CLKb3, and CLKb4.

Accordingly, when data is supplied on the data input line DIL at a rate of 2.5 G [bps], for example, the data detection units 111 to 114 and the changing point detection units 121 to 124 operate in interlacing fashion, with each unit being driven with a 625-MHz clock.

The data detection units 111 to 114 are each driven, for example, with a 625-MHz clock (data detection unit control signal CLKd1, CLKd2, CLKd3, or CLKd4), detect and discriminate the data carried in the input signal supplied on the data input line DIL, and output the data as received data (regenerated data). The outputs of the data detection units 111 to 114 are also supplied to the phase comparator circuit 104.

Likewise, the changing point detection units 121 to 124 are each driven, for example, with a 625-MHz clock (changing point detection unit control signal CLKb1, CLKb2, CLKb3, or CLKb4), detect and discriminate data changing points appearing in the input signal supplied on the data input line DIL, and supply the result to the phase comparator circuit 104.

The phase comparator circuit 104 compares the outputs of the data detection units 111 to 114 and changing point detection units 121 to 124, and supplies (feeds back) a feedback signal to the timing signal generating circuit 103 via the feedback line FL.

FIG. 5 is a diagram showing signal timings in the receiver circuit, and more specifically, the diagram shows the input signal and the phase relationship between the data detection clock CLKd supplied to the data detection/discrimination circuit 101 and the changing point detection clock CLKb supplied to the changing point detection/discrimination circuit 102 in FIG. 1 or the phase relationship between the data detection unit control signals CLKd1 to CLKd4 supplied to the data detection units 111 to 114 and the changing point detection unit control signals CLKb1 to CLKb4 supplied to the changing point detection units 121 to 124 in FIG. 4; as shown here, the phases of the respective clocks or signals are equally spaced apart from each other. More specifically, the data detection clock CLKd (CLKd1 to CLKd4) and the changing point detection clock CLKb (CLKb1 to CLKb4) have an equispaced phase relationship relative to each other with a phase difference of 90° (a phase difference of ½) for one bit of input signal transmission rate. Accordingly, when the changing point detection clock CLKb is at a changing point of the input signal, the data detection clock CLKd is located at the phase center of the input signal.

In FIG. 5, reference character CLKd-01 indicates one rise timing of a particular data detection clock CLKd (for example, the data detection unit control signal CLKd1) supplied to the data detection/discrimination circuit 101 (the data detection unit 111), and CLKd-02 indicates the rise timing immediately succeeding the rise timing CLKd-01 of that particular data detection clock CLKd (the data detection unit control signal CLKd1). Further, reference character CLKb-01 indicates the rise timing of the changing point detection clock CLKb (the changing point detection unit control signal CLKb1) supplied to the changing point detection/discrimination circuit 102 (the changing point detection unit 121), that occurs between the rise timings CLKd-01 and CLKd-02 of the data detection clock CLKd (the data detection unit control signal CLKd1).

As explained above with reference to FIGS. 2 and 3, in the phase combining circuit 103a, if φ0=T and φ1 =T−1 (φ0 and φ1 are changing linearly), then the output clock (phase-combined signal) θ is given as θ=T−x, which shows that when the amount of weighting, x, is varied linearly, the phase of the output clock θ also varies linearly.

However, because of the recent trend toward higher input signal speeds, lower power supply voltages, etc., the prior art timing signal generating circuit shown in FIG. 2 has had a problem when it comes to obtaining an intermediate signal with good accuracy. That is, the prior art timing signal generating circuit shown in FIG. 2 is configured to operate, for example, as a differential amplifier using the differential pair transistors 133 and 134, and to produce the output clock (phase-combined signal θ, θX) by flowing current to the load transistors 131 and 132. More specifically, the generation process of the output clock θ (θX) is, for example, as follows.

First, the output voltage (the voltage of the combined signal) decreases when the input transistor 133 (134) is turned on and the current whose value is determined by the weighted current source 136 flows to the load transistor 131 (132). On the other hand, when the input transistor 133 (134) is turned off, the output voltage increases with a time constant determined by the impedance, parasitic capacitance, etc. of the load transistor 131 (132), independently of the weighted current source 136.

That is, in the decreasing direction, the output voltage is dependent on the weighted current, but in the increasing direction, the voltage is independent of the weighted current, and this results in a waveform distortion. Further, in the increasing direction of the output voltage, the equation θ=T−x defining the operating principle does not apply, and this has presented a problem in obtaining an intermediate signal (combined signal: timing signal) with good accuracy.

Next, the basic functional configuration of the timing signal generating circuit of the present invention will be described.

FIG. 6 is a block diagram showing the basic functional configuration of the timing signal generating circuit according to the present invention; specifically, the essential portion of the phase combining circuit is conceptually shown here. In FIG. 6, reference character CSO is a combined signal output terminal, 31 to 34 are current polarity switching circuits, 35 is a voltage level correction circuit, and 36 is a parasitic capacitor on a combined node Ncs (combined signal output line). The basic configuration shown in FIG. 6 is a single-ended type, but it will be appreciated that a differential configuration may also be employed, as will be described later.

As shown in FIG. 6, the timing signal generating circuit (phase combining circuit) according to the present invention corresponds to the phase combining circuit 103a in the prior art timing signal generating circuit 103 shown in FIG. 2, and comprises the plurality of current polarity switching circuits 31, 32, 33, and 34, which are supplied with different phase signals φ0, φ1, φ0X, and φ1X, respectively, and the voltage level correction circuit 35. Here, the signals φ0, φ1, φ0X, and φ1X are four-phase clocks whose phases are spaced 90° apart relative to each other; for example, the clock signal φ0 is a signal having a 0° phase, the clock signal φ1 is a signal having a 90° phase, the clock signal φ0X is a signal having a 180° phase, and the clock signal φ1X is a signal having a 270° phase. The current polarity switching circuits 31 to 34 are each supplied, for example, with the weight signal (WS) output from the D/A converter 103b in FIG. 2, and the respective input signals (four-phase clocks φ0, φ1, φ0X, and φ1X) are weighted accordingly.

The current polarity switching circuits 31 to 34 are identical in configuration, each comprising a current source switching switch 311, a sourcing type current source (first current source) 312 connected between a high potential power supply line (first power supply line) Vdd and the current source switching switch 311, and a sinking type current source (second current source) 313 connected between the current source switching switch 311 and a low potential power supply line (second power supply line) Vss. The weighted outputs of the current polarity switching circuits 31 to 34 are combined, and the resulting signal is output as a combined signal from the combined node Ncs (combined signal output terminal CSO) after undergoing the voltage level correction by the voltage level correction circuit 35. In FIG. 6, the circuit is shown as comprising the four current polarity switching circuits 31 to 34 to which the four-phase clocks φ0, φ0X, φ1, and φ1X are supplied as input signals, but it will be appreciated that the timing signal generating circuit (phase combining circuit) of the present invention is not limited to the configuration shown here.

Each current polarity switching circuit 31 (32, 33, 34) is configured so that, when the input signal φ0 (φ0X, φ1, φ1X) is at a low level "L", for example, the current flows in a direction that sources the current toward the combined node Ncs (in the positive current direction), while when the input signal φ0 is at a high level "H", the current flows in a direction that sinks the current from the combined node Ncs (in the negative current direction).

Each current polarity switching circuit 31 (32, 33, 34), with its current sources 312 and 313 weighted as described above, outputs a current signal that has the phase of the input signal φ0 (φ0X, φ1, φ1X) and a weight corresponding to the current value determined by the current sources 312 and 313. Thus, in the phase combining circuit (signal combining circuit) 103a, the sum of the weighted output current signals of the current polarity switching circuits 31 to 34 is obtained at the combined node Ncs. Here, the current signal sum obtained at the combined node Ncs charges/discharges parasitic capacitance on a component device, wiring line, etc. and, in the case of the positive current direction, a voltage signal in the increasing direction is generated at the combined signal output terminal CSO, while in the case of the negative current direction, a voltage signal in the decreasing direction is generated at the combined signal output terminal CSO.

In the above configuration, the current polarity switching circuit 31 consists only of the current sources (sourcing type current source and sinking type current source) 312 and 313 and the switch (current source switching switch) 311, and the output impedances of the current sources 312 and 313 are high; as a result, the voltage level of the combined signal output terminal CSO is difficult to stabilize. To address this, the voltage level correction circuit 35 controls the voltage level to a specific voltage value in order to obtain a phase-combined signal having a stable voltage level.

As described above, according to the present invention, since the voltage of the phase-combined signal, whether in the increasing direction or in the decreasing direction, is determined by the current value of the weighted current source, a highly accurate intermediate signal (timing signal) can be generated using a simple configuration.

Embodiments of the timing signal generating circuit according to the present invention will now be described in detail below with reference to the accompanying drawings.

FIG. 7 is a block circuit diagram showing a first embodiment of the timing signal generating circuit according to the present invention.

As shown in FIG. 7, in the timing signal generating circuit (phase combining circuit) of the first embodiment, the current polarity switching circuit 31 (the configuration is the same for 32 to 34) comprises P-channel MOS transistors (PMOS transistors) 312a and 312b and N-channel MOS transistors (NMOS transistors) 311, 313a, 313b, and 313c.

In the current polarity switching circuit 31 in the timing signal generating circuit of the first embodiment, the NMOS transistor 311 corresponds to the current source switching switch, the PMOS transistor 312a corresponds to the sourcing type current source, and the NMOS transistor 313a corresponds to the sinking type current source. On the other hand, the voltage level correction circuit 35 comprises resistive elements 351 and 352 connected in series between the high potential power supply line vdd and the low potential power supply line Vss, and the voltage divided between the resistive elements 351 and 352 is applied to the combined signal output line (the combined node Ncs and the combined signal output terminal CSO). In FIG. 7, the parasitic capacitor on the combined signal output line is not shown.

Here, the weighting signal (current) WS is supplied to the drain and gate of the diode-connected transistor 313c, and is mirrored to the transistors 313b and 313a connected in a current-mirror configuration with the transistor 313c. Further, the current flowing through the transistor 313b flows through the transistor 312b, and is mirrored to the transistor 312a connected in a current-mirror configuration with the transistor 312b. The current flowing through the current sources 312a and 313a thus weighted by the weighting signal (current) WS is controlled by the current source switching switch 311 which in turn is controlled by the clock signal (input signal) φ0 applied to its gate.

Figure 8A:
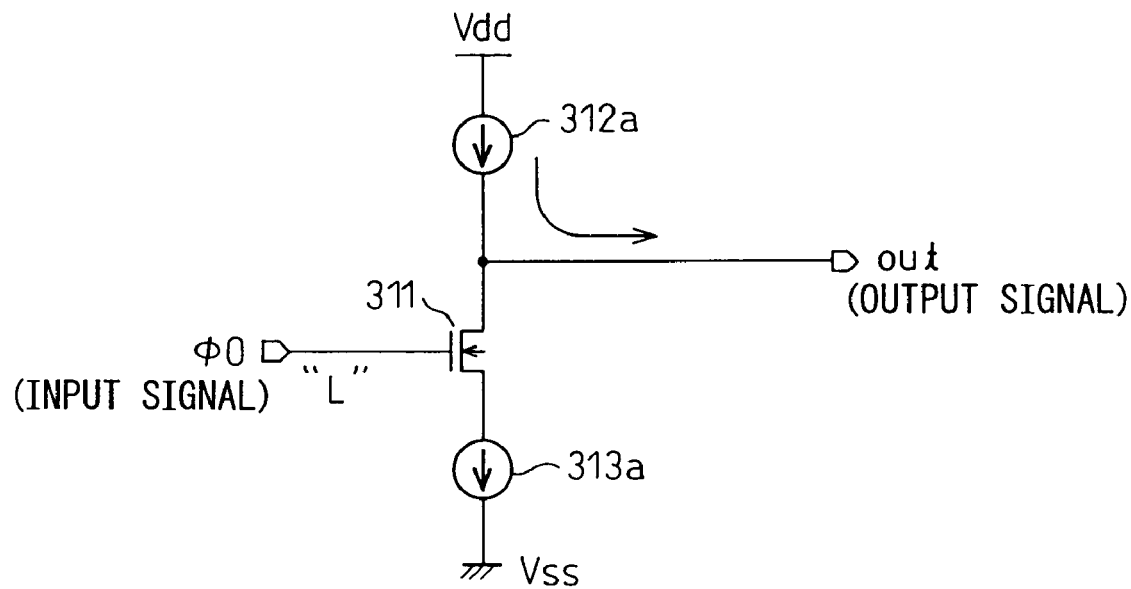
FIGS. 8A and 8B are diagrams (part 1) for explaining the operation of the timing signal generating circuit of FIG. 7.
Figure 8B:
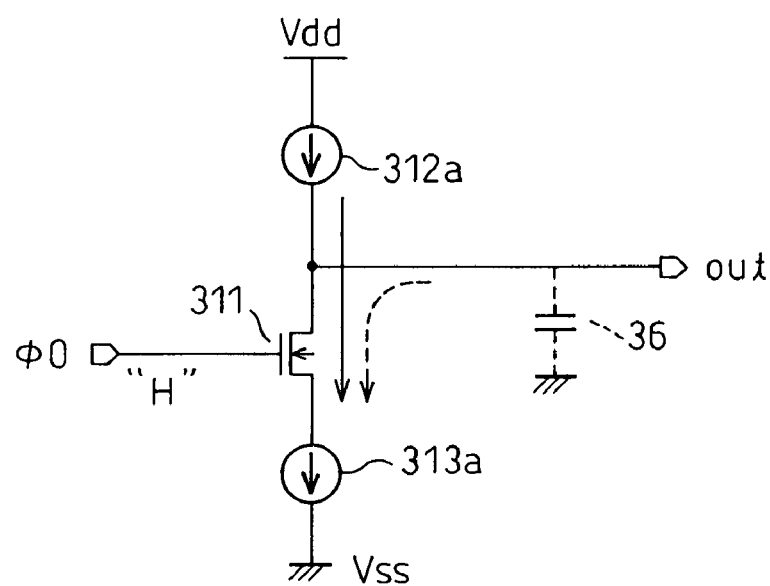

FIGS. 8A to 10 are diagrams for explaining the operation of the timing signal generating circuit of FIG. 7: FIGS. 8A and 8B show the current source switching switch 311, sourcing type current source 312a, and sinking type current source 313a in the current polarity switching circuit 31, FIG. 9 shows the relationship between the input signal φ0 and the output signal (output current) "out", and FIG. 10 shows the operating characteristics ($I_D$-$V_{DS}$ characteristics) of the PMOS and NMOS transistors.

As shown in FIGS. 8A and 9, when the clock signal (input signal) φ0 at a low level "L" is input to the input terminal (the gate of the transistor 311), the NMOS transistor (current source switching switch) 311 is turned off, and a current flows (in the positive current direction) toward the output terminal "out" (combined node NCS) via the sourcing type current source 312a provided between the current source switching switch 311 and the high potential power supply line Vdd.

Here, if the current mirror ratio is set in advance so that the current value of the sinking type current source 313a is larger (for example, by a factor of about 2) than the current value of the sourcing type current source 312a, then when the input signal φ0 at a high level "H" is input to the gate of the transistor 311, the current source switching switch 311 is turned on, and a current flows (in the negative current direction) toward the low potential power supply line Vss via the sourcing type current source 312a, the current source switching switch 311, and the sinking type current source 313a. At the same time, a current flows (in the negative current direction) from the output terminal "out" (combined node Ncs) toward the low potential power supply line Vss via the current source switching switch 311 and the sinking type current source 313a. The value of the current appearing at the output terminal "out" at this time is determined by the sourcing type current source 312a, and only the direction of the current is changed. When the parasitic capacitor 36 on the output terminal "out" (combined signal output signal line) side is taken into account, then when the input signal φ0 changes from the low level "L" to the high level "H", the charge stored in the parasitic capacitor 36 flows from the output terminal "out" side toward the low potential power supply line Vss via the sinking type current source 313a.

Further, when the operation of the timing signal generating circuit is viewed as a whole, if the plurality of current polarity switching circuits 31 to 34 are identical in configuration, it follows that a current signal that is determined only by the current values of the sourcing type current source 312a and sinking type current source 313a is obtained at the combined node Ncs, and as a result, a highly accurate intermediate signal (timing signal) can be generated.

Next, the voltage level correction circuit 35 will be described.

First, the characteristics of the current source transistors 312a and 313a in the current polarity switching circuit 31 will be considered. As shown in FIG. 10, the source-drain voltage $V_{DS}$ versus drain current $I_D$ characteristics are linear in the regions near the high potential supply voltage (Vdd) and the low potential supply voltage (Vss) and do not exhibit constant current characteristics in these regions. Accordingly, the voltage level of the phase-combined signal must be maintained within the saturation region of the current source transistors (PMOS transistor 312a and NMOS transistor 313a); in other words, the voltage level need only be maintained anywhere within the saturation region of the current source transistors 312a and 313a.

Here, since the impedances of the current sources are very high, a simple resistive divider circuit (voltage level correction circuit 35) such as shown in FIG. 7 can be used. Since the voltage level of the phase-combined signal need only be maintained anywhere within the saturation region of the current source transistors 312a and 313a, as described above, various configurations including those shown in FIGS. 11A to 11E hereinafter described can be employed.

FIGS. 11A to 11E are diagrams showing modified examples of the voltage level correction circuit in the timing signal generating circuit (phase combining circuit) of FIG. 7.

Figure 11A:
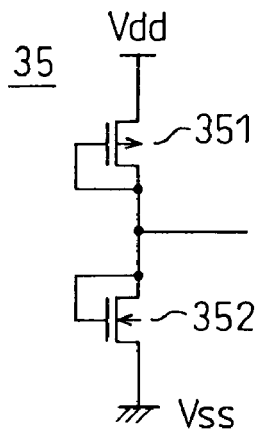
FIGS. 11A, 11B, 11C, 11D, and 11E are diagrams showing modified examples of a voltage level correction circuit in the timing signal generating circuit of FIG. 7.
Figure 11B:
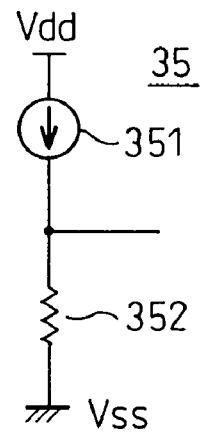
Figure 11C:
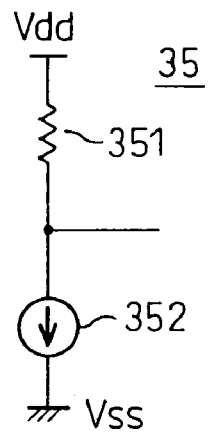

In the voltage level correction circuit 35 shown in FIG. 11A, the resistive elements 351 and 352 in the voltage level correction circuit of FIG. 7 are replaced by a diode-connected PMOS transistor and a diode-connected NMOS transistor, respectively, and in the voltage level correction circuit 35 shown in FIG. 11B, the resistive element 351 in the voltage level correction circuit of FIG. 7 is replaced by a current source, while in the voltage level correction circuit 35 shown in FIG. 11C, the resistive element 352 in the voltage level correction circuit of FIG. 7 is replaced by a current source.

Figure 11D:
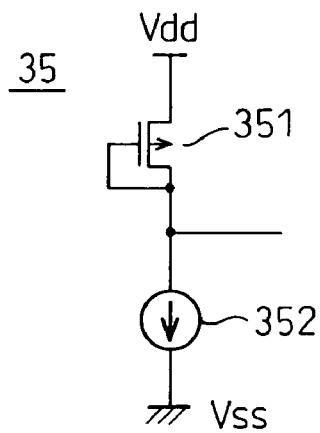
Figure 11E:
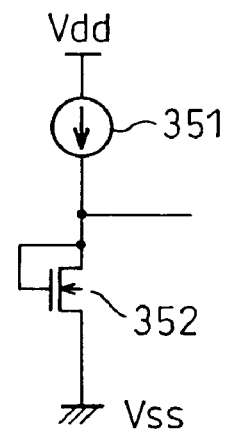

In the voltage level correction circuit 35 shown in FIG. 11D, the resistive element 351 in the voltage level correction circuit of FIG. 7 is replaced by a diode-connected PMOS transistor, and in the voltage level correction circuit 35 shown in FIG. 11E, the resistive element 352 in the voltage level correction circuit of FIG. 7 is replaced by a diode-connected NMOS transistor. As shown here, the voltage level correction circuit 35 can be configured in various ways.

Figure 12:
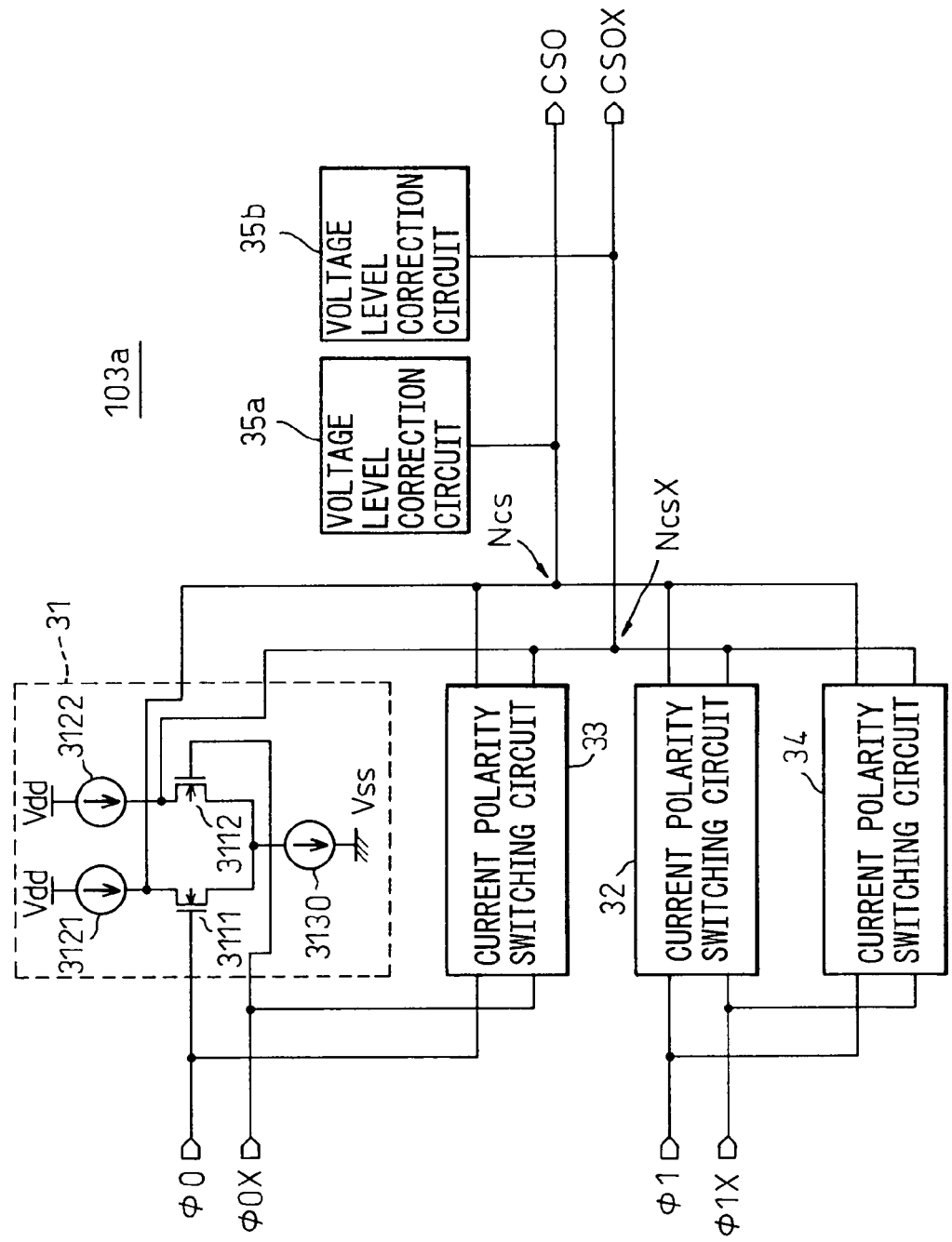
FIG. 12 is a block circuit diagram showing a second embodiment of the timing signal generating circuit according to the present invention.
Figure 13:
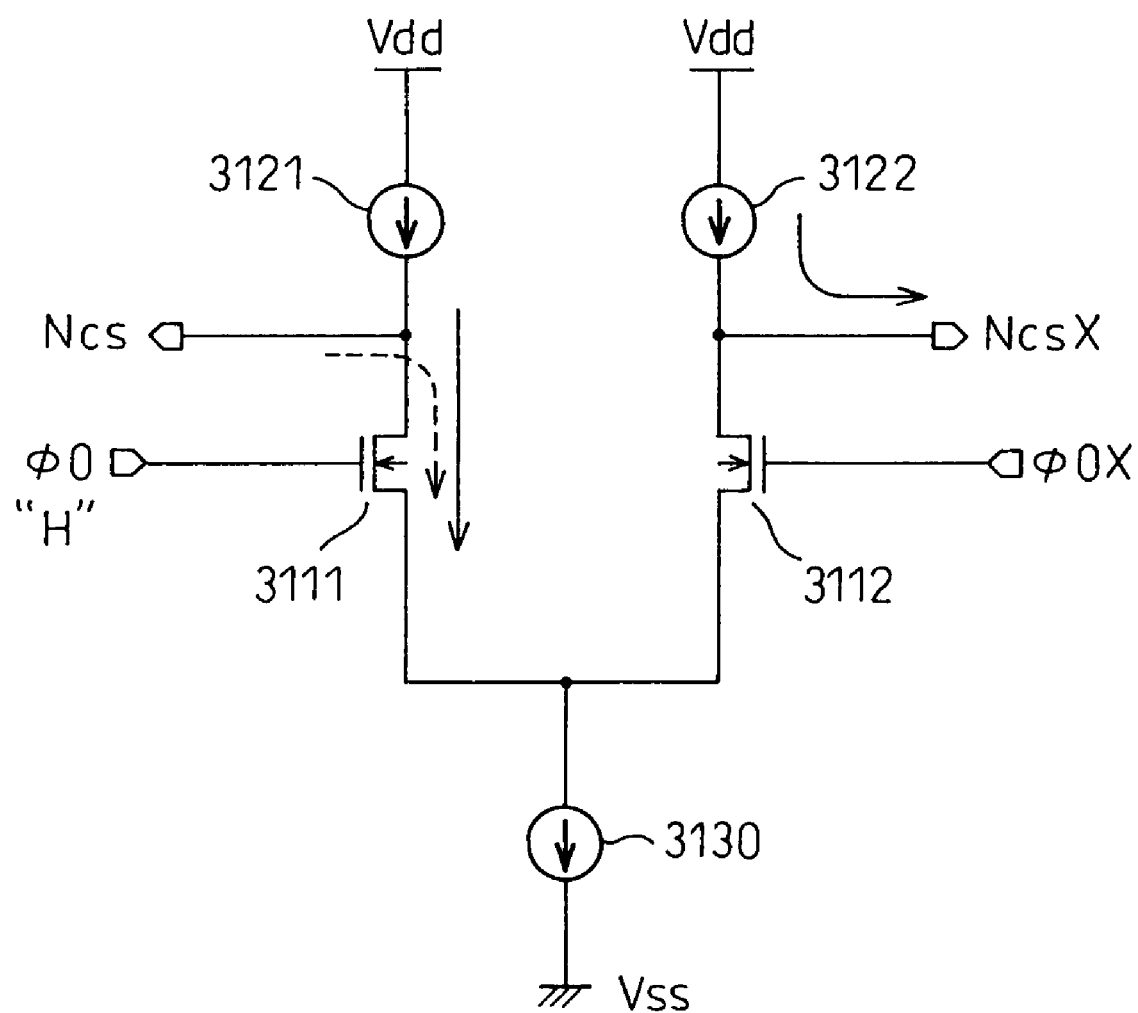
FIG. 13 is a diagram for explaining the operation of a current polarity switching circuit in the timing signal generating circuit of FIG. 12.

FIG. 12 is a block circuit diagram showing a second embodiment of the timing signal generating circuit according to the present invention, and FIG. 13 is a diagram for explaining the operation of the current polarity switching circuit in the timing signal generating circuit of FIG. 12.

As shown in FIGS. 12 and 13, the timing signal generating circuit (phase combining circuit) of the second embodiment corresponds to a circuit in which the phase combining circuit described with reference to FIG. 6 is configured as a differential circuit, and differential combined signals are taken from the combined signal output terminals CSO and CSOX. More specifically, the sourcing type current source 312 and the current source switching switch 311 in the current polarity switching circuit 31 in the phase combining circuit of FIG. 6 are respectively configured as sourcing type current sources 3121, 3122 and current source switching switches (NMOS transistors) 3111, 3112 to correspond with the differential input signals φ0 and φ0X, and weighted signals are taken from the connection nodes between the sourcing type current sources 3121, 3122 and the drains of the transistors 3111, 3112, respectively, and are coupled to the respective differential combined nodes Ncs and NcsX. In the second embodiment, the sinking type current source 313 in the current polarity switching circuit 31 in the phase combining circuit of FIG. 6 is configured so as to be shared between them, and the sources of the transistors 3111 and 3112 are connected together and coupled to the low potential power supply line Vss via the sinking type current source 3130.

In the current polarity switching circuit 31 shown in FIG. 13, when the positive logic input signal φ0 is at a high level "H" and the negative logic input signal φ0X is at a low level "L", the transistor 3111 is ON and the transistor 3112 is OFF. Here, if the current value of the sinking type current source 3130 is set larger in advance (for example, by a factor of about 2) than the current value of the sourcing type current sources 3121 and 3122, the transistor (current source switching switch) 3112 is turned off, and a current flows (in the positive current direction) toward the output terminal "out" (combined node Ncs) via the sourcing type current source 3122 provided between the current source switching switch 3112 and the high potential power supply line vdd, as in the previously described case of FIG. 8A. Further, as in the previously described case of FIG. 8B, the transistor (current source switching switch) 3111 is turned on, and a current flows toward the low potential power supply line Vss via the sourcing type current source 3121, the current source switching switch 3111, and the sinking type current source 3130. At the same time, a current flows (in the negative current direction) from the output terminal "out" (combined node Ncs) toward the low potential power supply line Vss via the current source switching switch 3111 and the sinking type current source 3130.

For the voltage level correction circuits 35a and 35b, use can be made of the various circuit configurations shown in FIG. 7 and FIGS. 11A to 11E.

Figure 14:
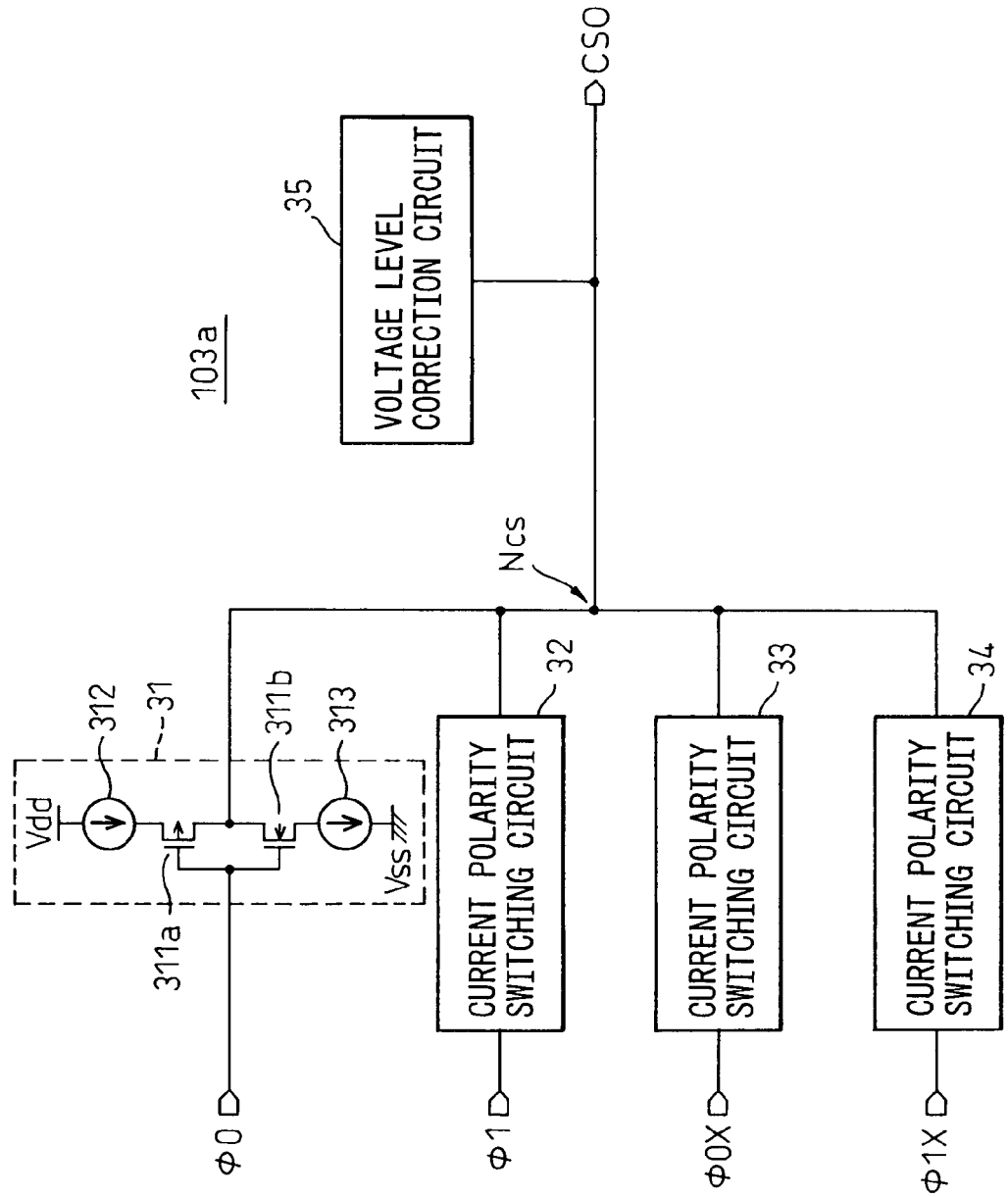
FIG. 14 is a block circuit diagram showing a third embodiment of the timing signal generating circuit according to the present invention.

FIG. 14 is a block circuit diagram showing a third embodiment of the timing signal generating circuit according to the present invention.

As is apparent from a comparison between FIG. 14 and FIG. 6, the timing signal generating circuit (phase combining circuit) of the third embodiment corresponds to a circuit in which the current polarity switching switch 311 in the current polarity switching circuit 31 (32 to 34) of FIG. 6 is constructed from a CMOS inverter comprising a PMOS transistor 311a and an NMOS transistor 311b.

Figure 15A:
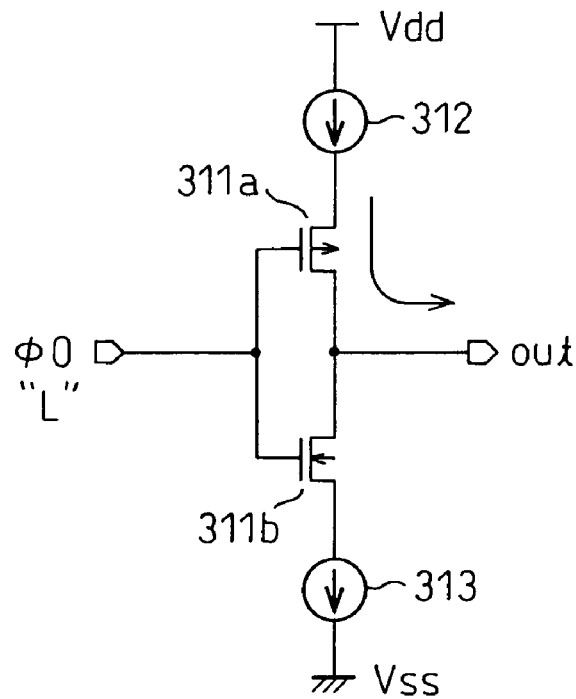
FIGS. 15A and 15B are diagrams (part 1) for explaining the operation of a current polarity switching circuit in the timing signal generating circuit of FIG. 14.
Figure 15B:
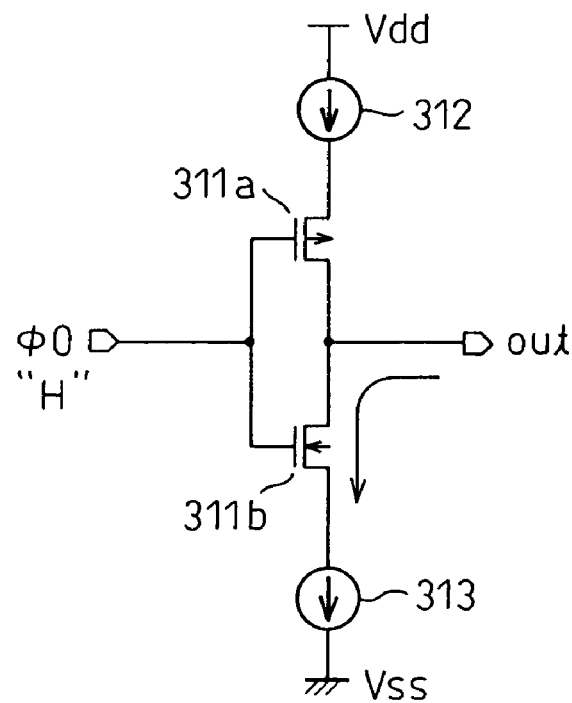

FIGS. 15A, 15B, and 16 are diagrams for explaining the operation of the current polarity switching circuit in the timing signal generating circuit of FIG. 14.

First, as shown in FIG. 15A, when the clock signal (input signal) φ0 at a low level "L" is input to the input terminal (the gates of the transistors 311a and 311b, i.e., the input of the inverter), the PMOS transistor 311a is turned on and the NMOS transistor 311b is turned off, and a current flows (in the positive current direction) toward the output terminal "out" (combined node Ncs) via the sourcing type current source 312 provided between the source of the transistor 311a and the high potential power supply line Vdd, thus sourcing the current determined by the sourcing type current source 312.

On the other hand, as shown in FIG. 15B, when the input signal φ0 at a high level "H" is input to the gates of the transistors 311a and 311b, the PMOS transistor 311a is turned off and the NMOS transistor 311b is turned on, thus sinking the current determined by the sinking type current source 313 from the output terminal "out" toward the low potential power supply line Vss (in the negative current direction). Therefore, as shown in FIG. 16, as the input signal (φ0) changes, the current value determined by the sourcing type current source 312 is output in the case the positive current direction taken relative to the current=0, while in the case of the negative current direction, the current value determined by the sinking type current source 313 is output.

In the timing signal generating circuit as a whole, this means that a current signal that is determined only by the current sources (sourcing type current source 312 and sinking type current source 313) is obtained at the combined node Ncs, and as a result, a highly accurate intermediate signal (timing signal) can be generated. Further, as in the foregoing embodiments, the voltage level at the combined signal output terminal CSO need only be maintained within the saturation region of the current source transistors, and also, the voltage level correction circuit 35 can be constructed using any one of the various circuit configurations shown in FIGS. 7 and 11A to 11E.

Figure 17:
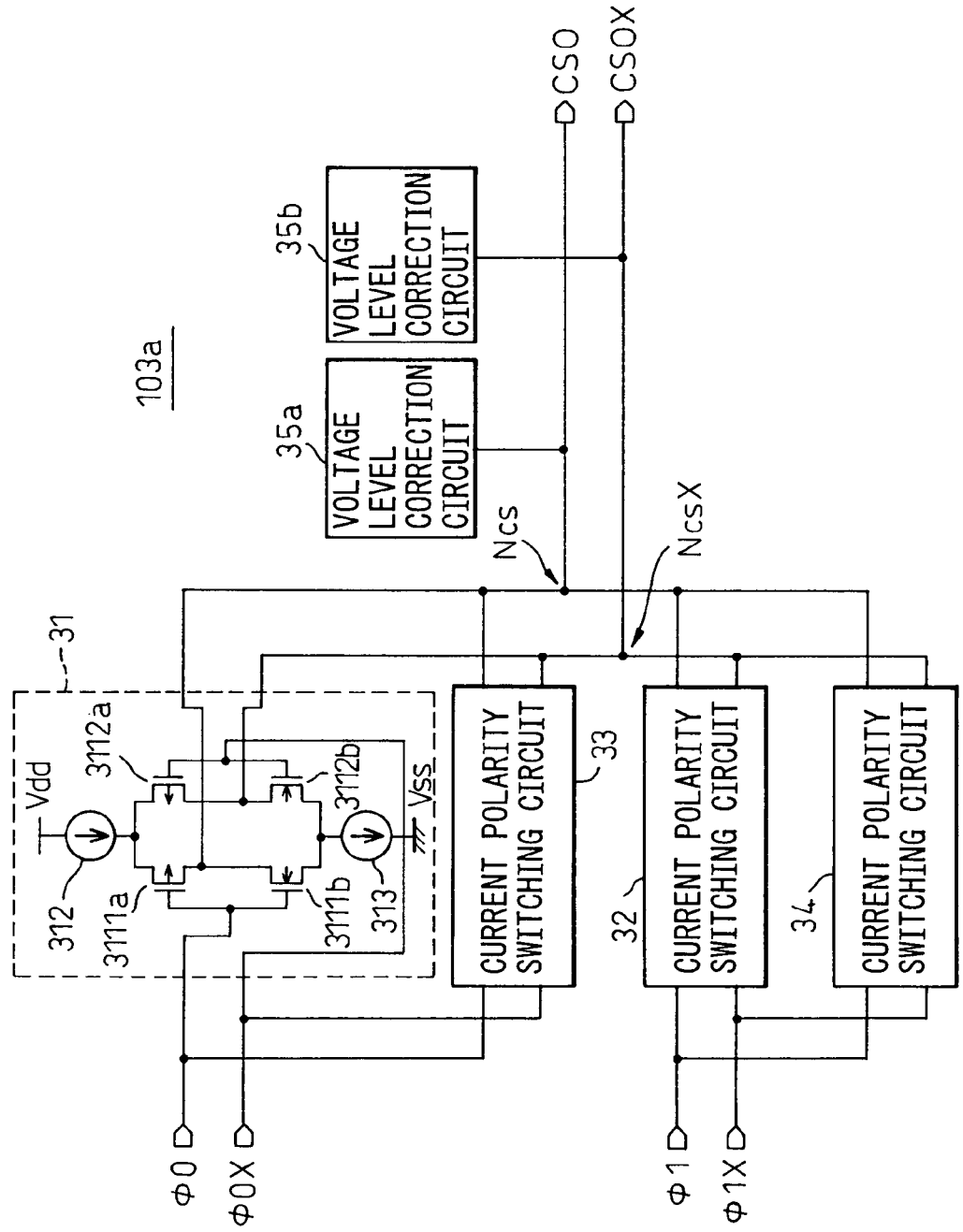
FIG. 17 is a block circuit diagram showing a fourth embodiment of the timing signal generating circuit according to the present invention.

FIG. 17 is a block circuit diagram showing a fourth embodiment of the timing signal generating circuit according to the present invention.

As is apparent from a comparison between FIG. 17 and FIG. 14, the timing signal generating circuit (phase combining circuit) of the fourth embodiment corresponds to a circuit in which the timing signal generating circuit of the third embodiment is configured as a differential circuit. More specifically, the current polarity switching circuits 31 to 34 each comprise a sourcing type current source 312, a sinking type current source 313, and two inverters (transistors 311a, 311b and 312a, 312b), and the outputs of the current polarity switching circuits 31 to 34 are combined at the differential combined nodes Ncs and NcsX. The operation (current flow) for each of the positive logic and negative logic signals is the same as that described in the foregoing third embodiment and, in this embodiment also, the voltage level correction circuit 35 can be constructed using any one of the various circuit configurations shown in FIGS. 7 and 11A to 11E.

Figure 18:
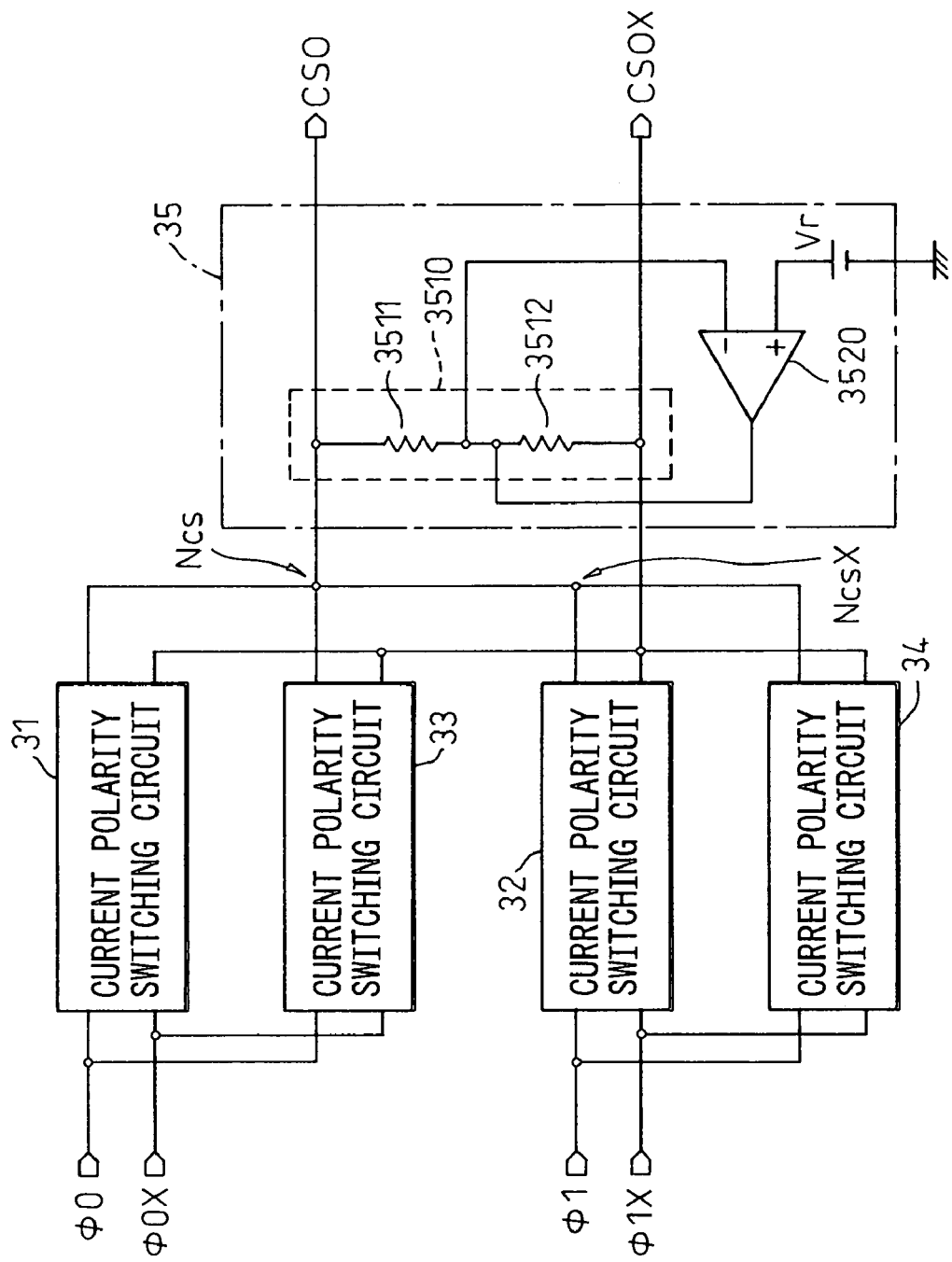
FIG. 18 is a block circuit diagram showing a fifth embodiment of the timing signal generating circuit according to the present invention.

FIG. 18 is a block circuit diagram showing a fifth embodiment of the timing signal generating circuit according to the present invention.

In the timing signal generating circuit of the fifth embodiment, the voltage level correction circuit 35 is constructed as a negative feedback circuit and, compared with the circuits previously shown in FIGS. 11A to 11E, the voltage levels at the combined nodes Ncs and NcsX (the center voltage Vm of the differential combined signal output terminals CSO and CSOX) can be adjusted to the desired voltage level with a high degree of accuracy.

That is, as shown in FIG. 18, the voltage level correction circuit 35 comprises a voltage level monitoring circuit 3510 which monitors the voltage levels (differential combined terminal voltage levels) at the differential combined nodes Ncs and NcsX, and a differential amplifier (operational amplifier) 3520 which takes a reference voltage Vr as an input. The voltage level monitoring circuit 3510 comprises resistive elements 3511 and 3512 connected to the respective combined nodes Ncs and NcsX, and the voltage divided between the resistive elements 3511 and 3512 is applied to the negative input terminal of the operational amplifier 3520. The positive input terminal of the operational amplifier 3520 is supplied with the reference voltage Vr.

When the two resistive elements 3511 and 3512 are chosen to have the same resistance value, the voltage level monitoring circuit 3510 outputs the center voltage of the combined nodes Ncs and NcsX (the center voltage Vm of the differential combined signal output terminals CSO and CSOX). The center voltage Vm of the differential combined signal output terminals CSO and CSOX is applied to the negative input terminal of the operational amplifier 3520, and when the center voltage Vm is higher than the reference voltage, the operational amplifier 3520 outputs a low signal, thus operating in a direction that reduces the center voltage Vm, while when the center voltage Vm is lower from the beginning, the operational amplifier 3520 outputs a high signal, thus operating in a direction that increases the center voltage Vm, and the center voltage Vm is thus caused to settle down to the reference voltage Vr. Here, the center voltage Vm represents the center value of the differential combined signal output terminals CSO and CSOX; therefore, at the same time that the negative feedback settles, the center voltage level of the differential combined terminals settles down to the reference voltage.

In the above description, it will be appreciated that the various differential current polarity switching circuits earlier described can be applied as the current polarity switching circuits 31 to 34.

Figure 19:
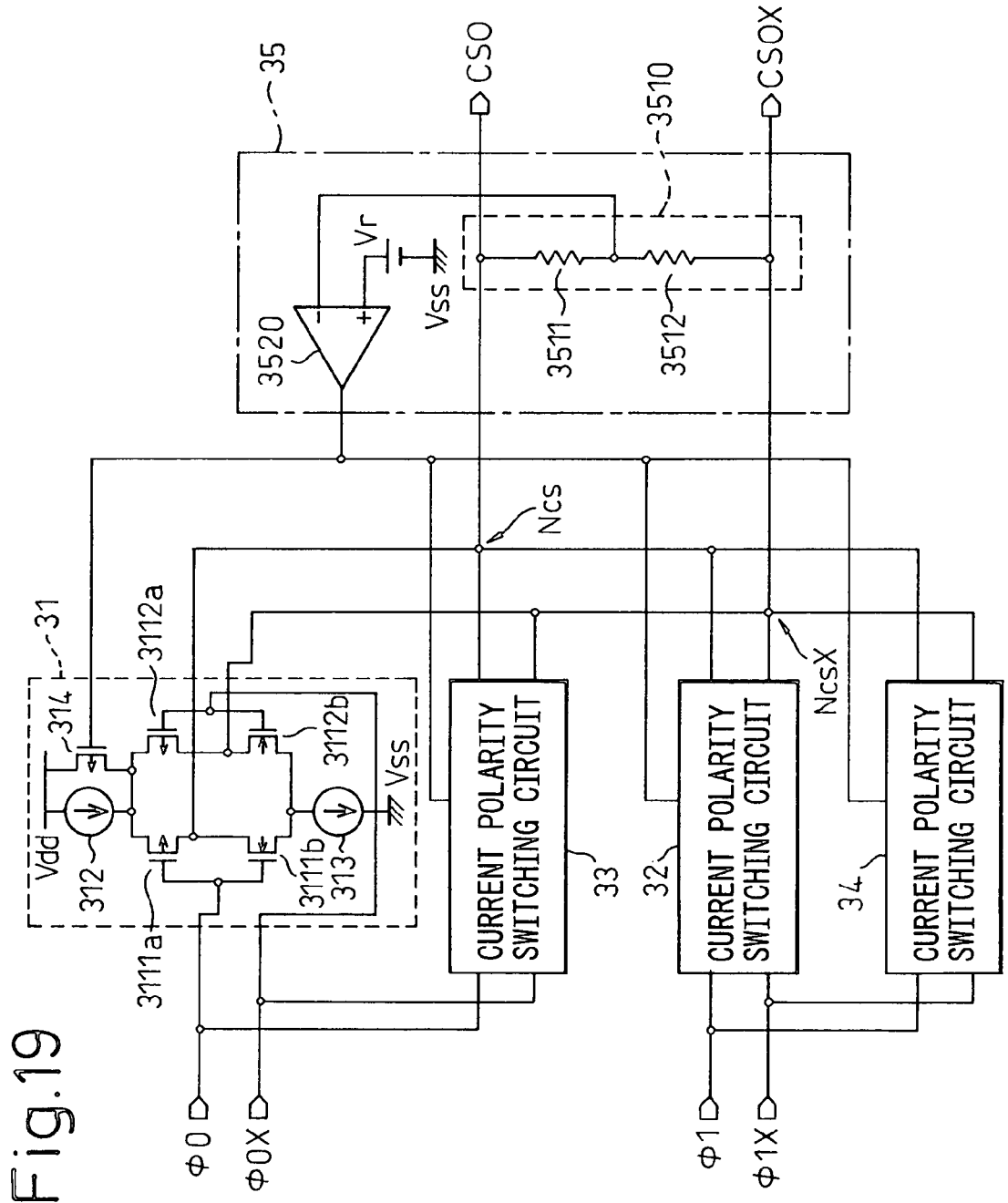
FIG. 19 is a block circuit diagram showing a sixth embodiment of the timing signal generating circuit according to the present invention.

FIG. 19 is a block circuit diagram showing a sixth embodiment of the timing signal generating circuit according to the present invention.

As is apparent from a comparison between FIG. 19 and FIG. 18, the voltage level correction circuit 35 in the timing signal generating circuit of the sixth embodiment is configured to control the center voltage Vm of the combined nodes Ncs and NcsX (the combined signal output terminals CSO and CSOX), not directly by the output of the operational amplifier 3520 as in the foregoing fifth embodiment, but by adjusting the current flowing through a current correction pMOS transistor 314 connected in parallel to the sourcing type current source 312 in the current polarity switching circuit (31) of the fourth embodiment shown in FIG. 17.

More specifically, the voltage level monitoring circuit 3510 outputs the center voltage Vm of the combined nodes Ncs and NcsX (the differential combined signal output terminals CSO and CSOX); here, if the center voltage Vm is higher than the reference voltage, the operational amplifier 3520 outputs a low signal, and the gate voltage of the current correction pMOS transistor 314 thus decreases. As a result, a current flows through the current correction pMOS transistor 314, and the current in the direction flowing out the output of the current polarity switching circuit 31 increases, thus causing the center voltage Vm of the combined signal output terminals CSO and CSOX to increase. At this time, if the current ratio of the sinking type current source 313 is set larger in advance than the sourcing type current source 312, control can be performed in such a manner as to lower the center voltage Vm when the current flowing through the current correction pMOS transistor 314 is small and raise the center voltage Vm when the current flowing through the current correction pMOS transistor 314 is large. In this way, the level of the center voltage Vm of the combined signal output terminals CSO and CSOX can be controlled to the reference voltage.

Figure 20:
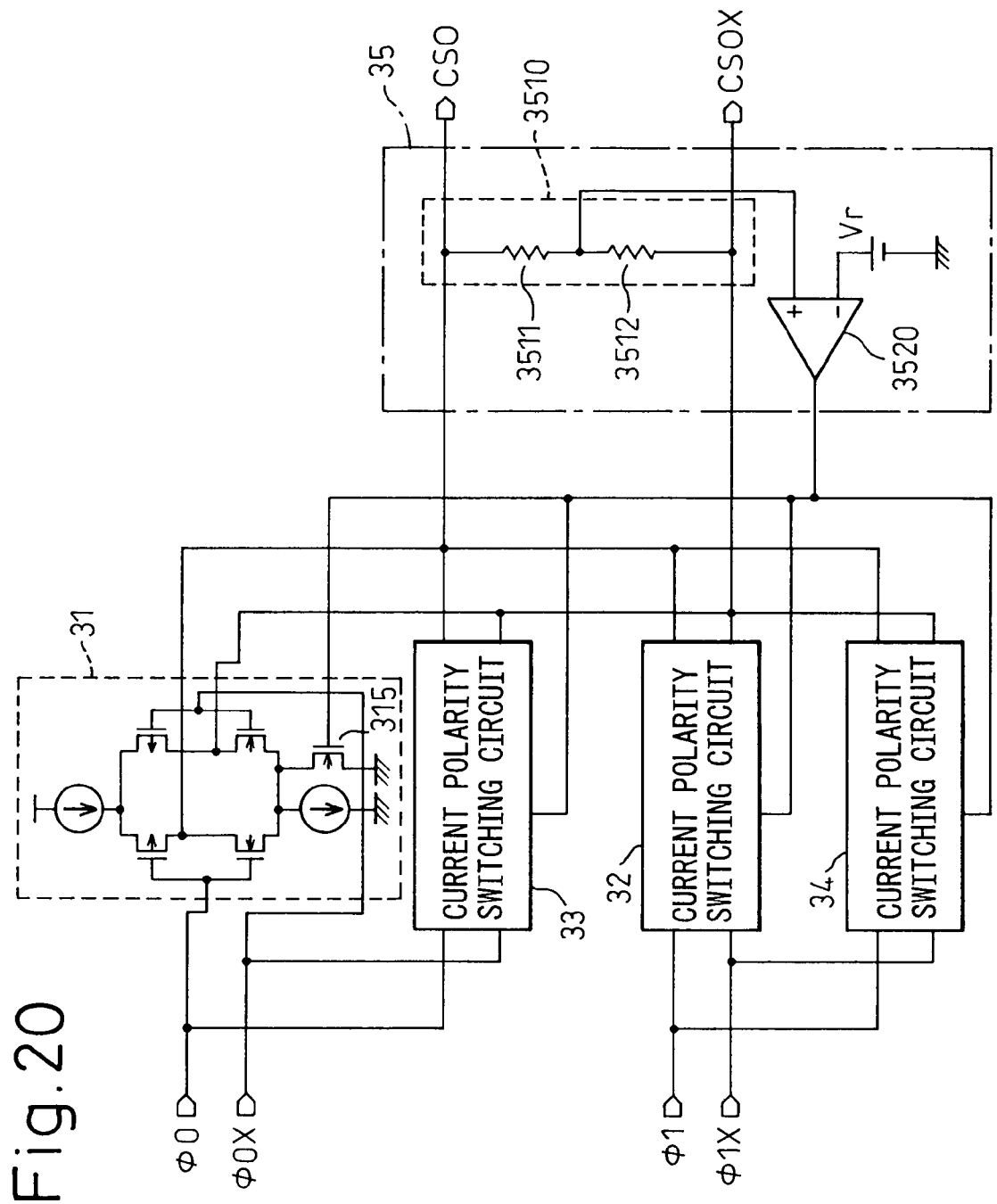
FIG. 20 is a block circuit diagram showing a seventh embodiment of the timing signal generating circuit according to the present invention.

FIG. 20 is a block circuit diagram showing a seventh embodiment of the timing signal generating circuit according to the present invention.

As is apparent from a comparison between FIG. 20 and FIG. 19, the voltage level correction circuit 35 in the timing signal generating circuit of the seventh embodiment is configured to supply the output of the operational amplifier 3520 to the gate of a current correction nMOS transistor 315 connected in parallel to the sinking type current source 313, not to the gate of the current correction pMOS transistor 314 connected in parallel to the sourcing type current source 312 as in the foregoing sixth embodiment.

In the seventh embodiment, as the transistor to be controlled by the output of the operational amplifier 3520 is changed to the nMOS transistor 315, the circuit is configured so that the output of the voltage level monitoring circuit 3510 is input to the positive input terminal of the operational amplifier 3520 and the reference voltage Vr to the negative input terminal of the operational amplifier 3520. Further, in the seventh embodiment, the current ratio of the sourcing type current source 312 is set larger in advance than the sinking type current source 313, and control is performed in such a manner as to raise the center voltage Vm when the current flowing through the current correction nMOS transistor 315 is small and lower the center voltage Vm when the current flowing through the current correction nMOS transistor 315 is large.

Figure 21:
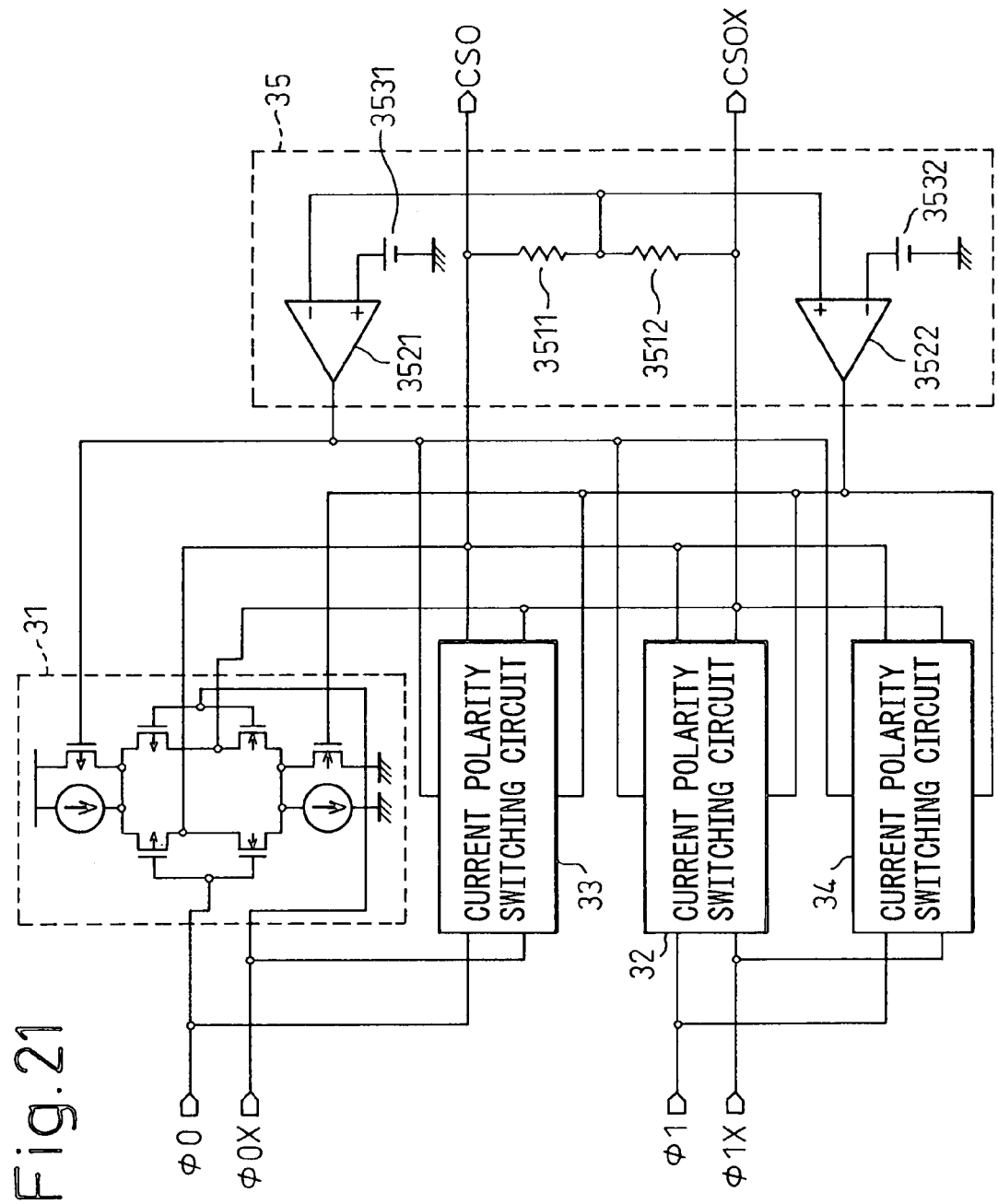
FIG. 21 is a block circuit diagram showing an eighth embodiment of the timing signal generating circuit according to the present invention.

FIG. 21 is a block circuit diagram showing an eighth embodiment of the timing signal generating circuit according to the present invention; as shown, this embodiment is a combination of the sixth embodiment of FIG. 19 and the seventh embodiment of FIG. 20.

Figure 22:
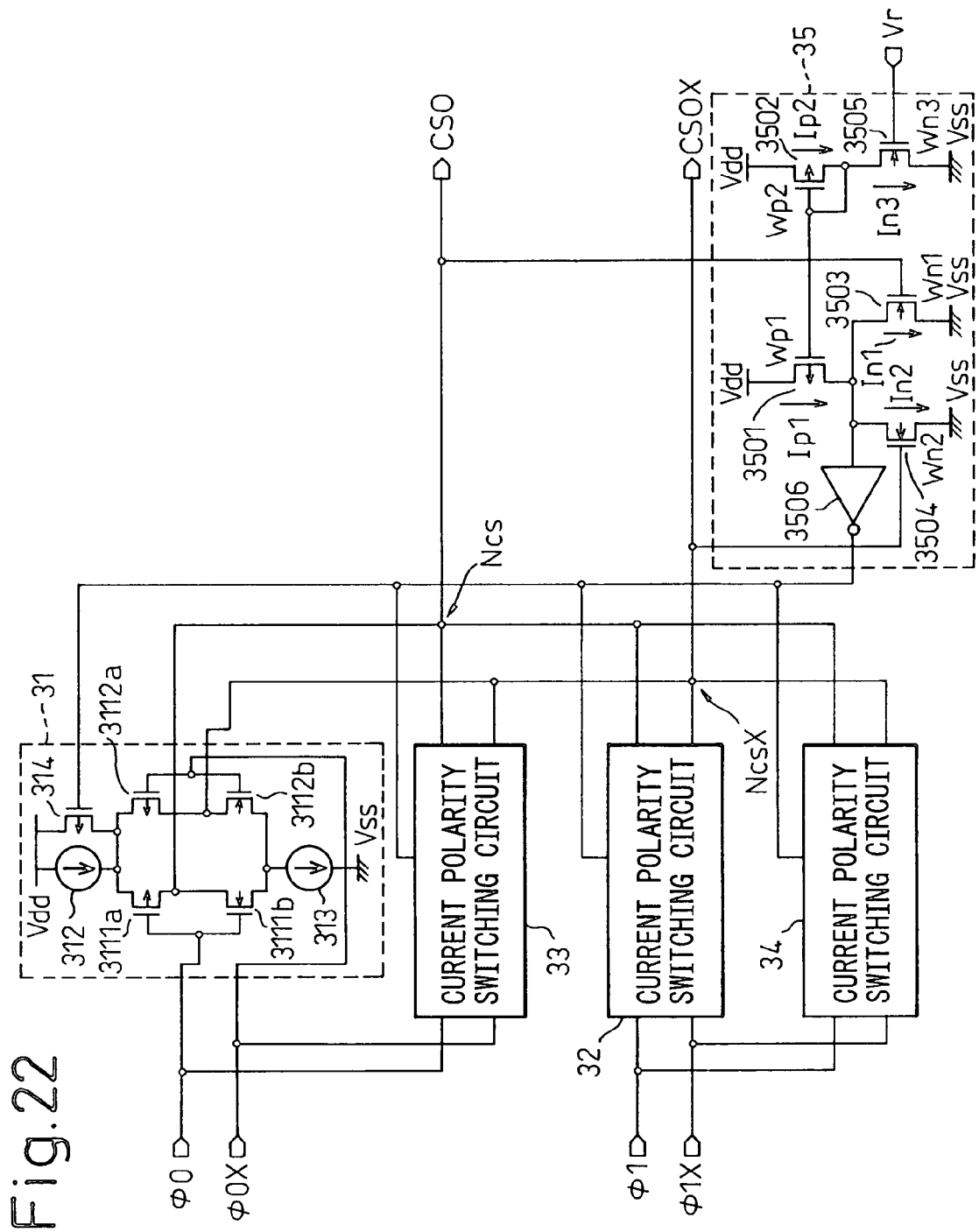
FIG. 22 is a block circuit diagram showing a ninth embodiment of the timing signal generating circuit according to the present invention.

FIG. 22 is a block circuit diagram showing a ninth embodiment of the timing signal generating circuit according to the present invention.

As shown in FIG. 22, in the timing signal generating circuit of the ninth embodiment, the voltage level correction circuit 35 comprises pMOS transistors 3501 and 3502, nMOS transistors 3503, 3504, and 3505, and an inverter 3506. Here, the gate widths of the pMOS transistors 3501 and 3502 are denoted by Wp1 and Wp2, respectively, and the gate widths of the nMOS transistors 3503, 3504, and 3505 are denoted by Wn1, Wn2, and Wn3, respectively. Further, the currents flowing through the pMOS transistors 3501 and 3502 are denoted by Ip1 and Ip2, respectively, and the currents flowing through the nMOS transistors 3503, 3504, and 3505 are denoted by In1, In2, and In3, respectively. The gate widths of the pMOS transistors 3501 and 3502 are chosen to satisfy the relation Wp1=2×Wp2, while the gate widths of the nMOS transistors 3503, 3504, and 3505 are chosen to satisfy the relation Wn1=Wn2=Wn3.

In the voltage level correction circuit 35 in the timing signal generating circuit of the ninth embodiment shown in FIG. 22, when the reference voltage Vr is applied to the gate of the transistor 3505, the current In3 flows through the transistor 3505. The current Ip2 that flows through the transistor 3502 is the same as the current In3 of the transistor 3505 (Ip2=In3); on the other hand, the current Ip1 that flows through the transistor 3501 is twice the current Ip2 that flows through the transistor 3502 (Ip1=2×Ip2), since the transistor 3501 is connected in a current-mirror configuration with the transistor 3502 and since the gate width Wp1 of the transistor 3501 is twice the gate width Wp2 of the transistor 3502. In other words, the current Ip1 that flows through the transistor 3501 is determined by the reference voltage Vr. Here, the reference voltage Vr is set, for example, as Vdd/2.

The transistors 3503 and 3504, whose gates are connected to the combined nodes Ncs and NcsX (the differential combined signal output terminals CSO and CSOX), monitor the differential outputs appearing at the combined signal output terminals, and the currents In1 and In2 proportional to the voltages at the combined signal output terminals CSO and CSOX flow through the respective transistors. Here, the drains of the transistors 3503 and 3504 are shorted together, and thus the sum of the currents (In1+In2) flowing through the transistors 3503 and 3504 is obtained. Since the outputs at the combined signal output terminals CSO and CSOX are in a differential relationship, the sum of the currents (In1+In2) flowing through the transistors 3503 and 3504 is, in effect, a direct current, and this current sum (In1+In2) is determined by the voltages at the combined signal output terminals CSO and CSOX.

The current Ip1 flowing through the transistor 3501, which is determined by the reference voltage Vr, and the sum of the currents (In1+In2) flowing through the transistors 3503 and 3504, which is determined by the voltages at the combined signal output terminals CSO and CSOX, are taken as an output of the voltage level correction circuit 35 via the inverter 3506, and the output of the voltage level correction circuit 35 is supplied (coupled in negative feedback form) to the gate of the current correction pMOS transistor 314 connected in parallel to the sourcing type current source 312 in the current polarity switching circuit (31).

More specifically, when Ip1>In1+In2, for example, that is, when the reference voltage Vr is larger than the center voltage Vm of the combined signal output terminals CSO and CSOX, the output voltage of the voltage level correction circuit 35 is high, and the current flowing through the transistor 314 decreases, thus operating to force the center voltage Vm to be identical with the level of the reference voltage Vr. Conversely, when Ip1<In1+In2, that is, when the reference voltage Vr is smaller than the center voltage Vm, the output voltage of the voltage level correction circuit 35 is low, and the current flowing through the transistor 314 increases, thus operating to force the center voltage Vm to be identical with the level of the reference voltage Vr.

Figure 23:
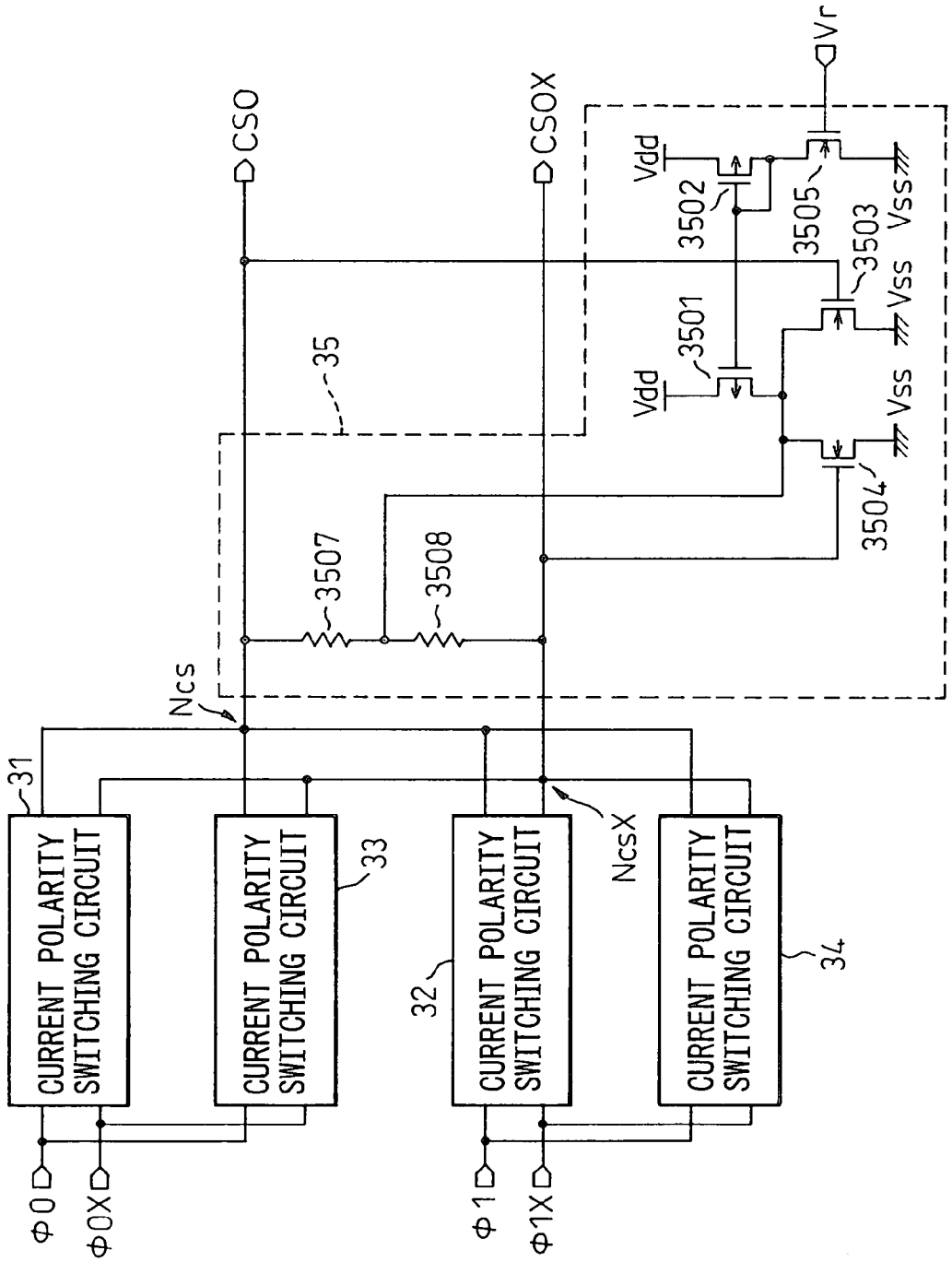
FIG. 23 is a block circuit diagram showing a 10th embodiment of the timing signal generating circuit according to the present invention.

FIG. 23 is a block circuit diagram showing a 10th embodiment of the timing signal generating circuit according to the present invention.

As is apparent from a comparison between FIG. 23 and FIG. 22, the voltage level correction circuit 35 in the timing signal generating circuit of the 10th embodiment is configured to directly control the center voltage Vm of the combined nodes Ncs and NcsX (the combined signal output terminals CSO and CSOX) via resistive elements 3507 and 3508, unlike the timing signal generating circuit of the foregoing ninth embodiment which is configured to supply the output of the voltage level correction circuit (the output inverted by the inverter 3506) to the gate of the current correction pMOS transistor 314 connected in parallel to the sourcing type current source 312 in the current polarity switching circuit (31).

Figure 24:
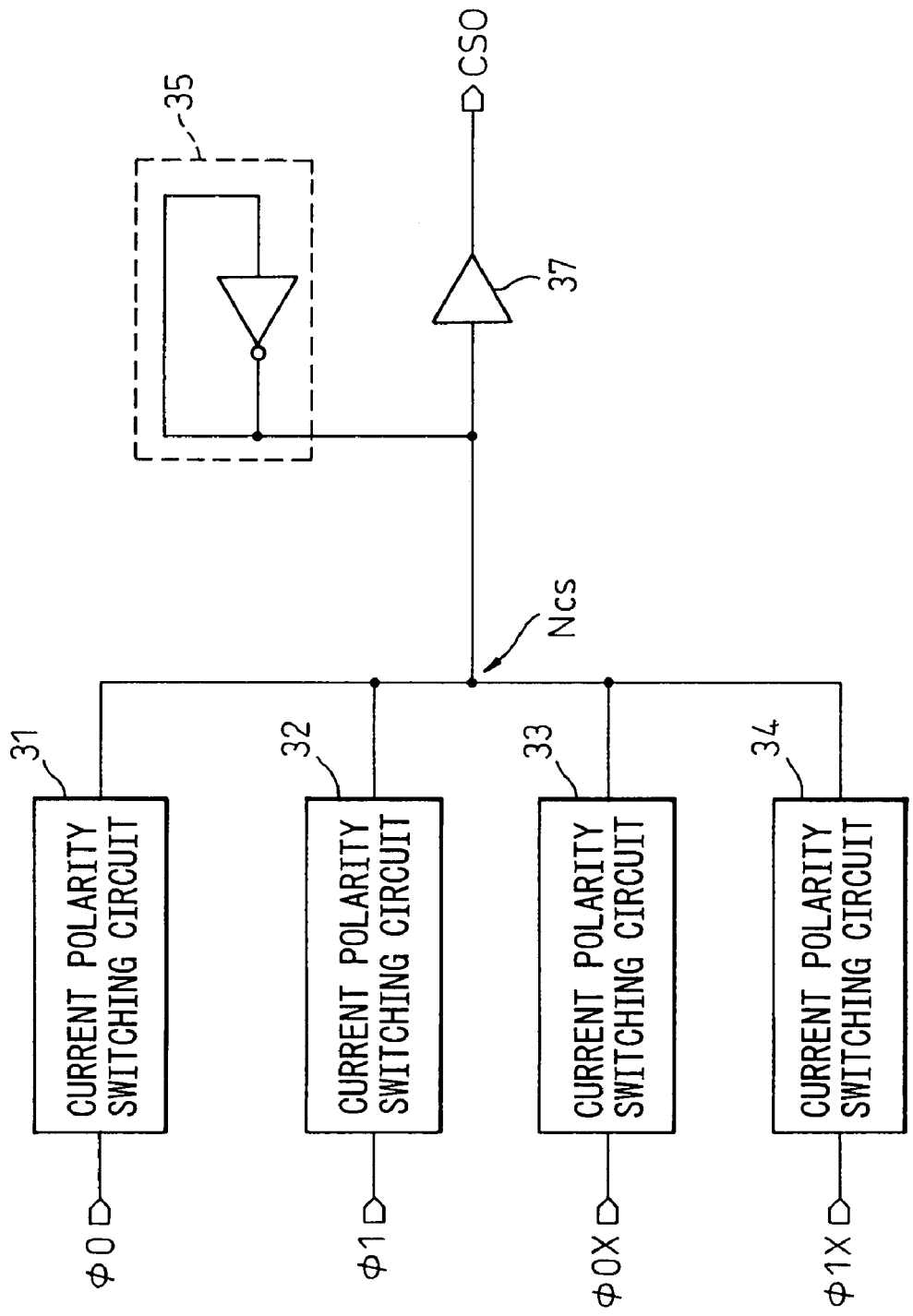
FIG. 24 is a block circuit diagram showing an 11th embodiment of the timing signal generating circuit according to the present invention.
Figure 25:
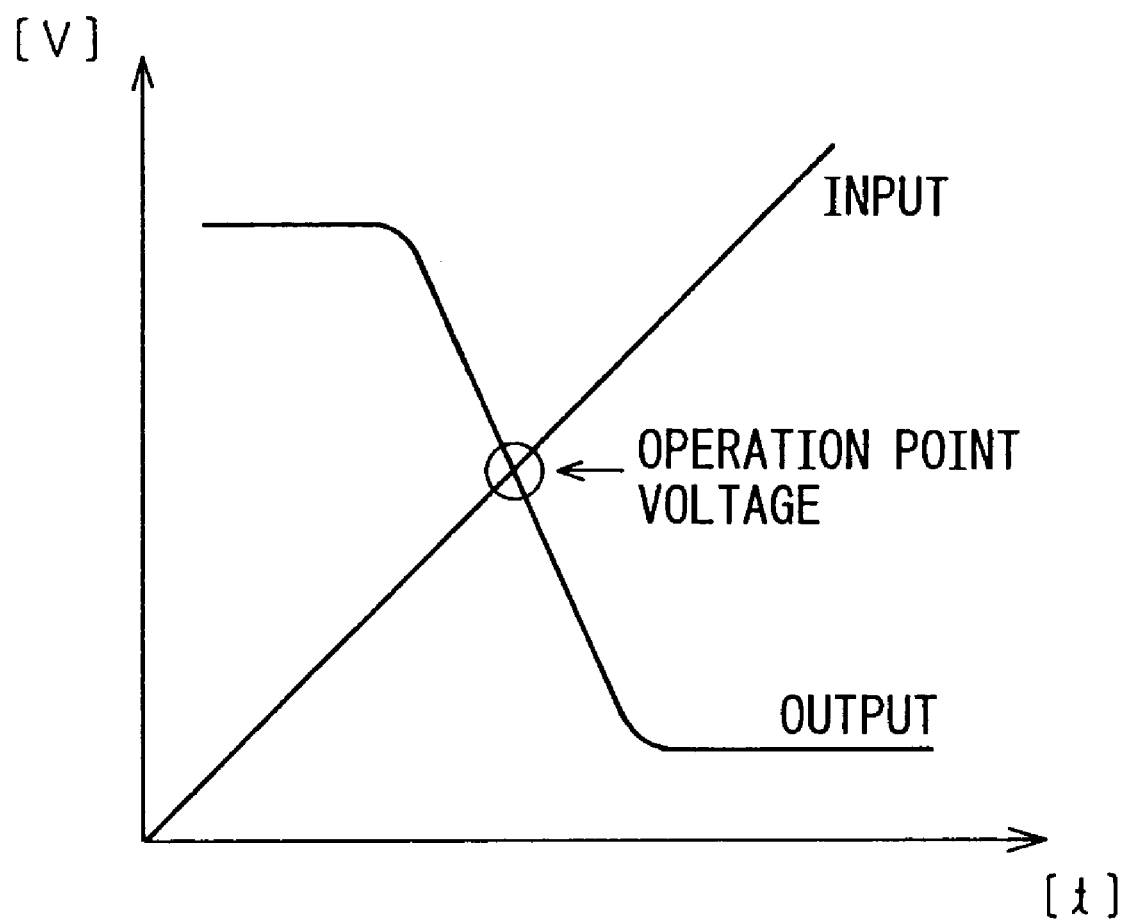
FIG. 25 is a diagram for explaining the operation of the timing signal generating circuit of the 11th embodiment shown in FIG. 24.

FIG. 24 is a block circuit diagram showing an 11th embodiment of the timing signal generating circuit according to the present invention, and FIG. 25 is a diagram (showing the DC characteristics of an amplifier) for explaining the operation of the timing signal generating circuit of the 11th embodiment shown in FIG. 24.

As shown in FIG. 24, the timing signal generating circuit of the 11th embodiment comprises an amplifying circuit (amplifier) 37 for amplifying the phase-combined signal, and a voltage level correction circuit 35 for correcting the voltage level of the phase-combined signal. The 11th embodiment can be directly applied, for example, to the timing signal generating circuit shown in any one of the previously described first to third embodiments, and can even be applied to a differential type circuit such as shown in the fourth embodiment.

That is, in the case of the signal combining circuit (timing signal generating circuit) using the current polarity switching circuits 31 to 34, since the output voltage level of the combined signal output terminal CSO need only be maintained within the saturation region of the current source transistors, as previously explained in the description of the first embodiment with reference to FIGS. 7 to 11E, a large degree of latitude is allowed. On the other hand, as shown in FIG. 25, the amplifier has an operation point level at which the best gain is obtained, and the operation point level represents the voltage (operation point voltage) where the input and output DC characteristics of the amplifier coincide. Further, since the operation point level is the level at which the input and output levels of the amplifier coincide, the operation point level can be easily obtained by a circuit constructed from an amplifier (or a circuit similar to an amplifier) whose input and output terminals are shorted together.

In this way, from the standpoint of the amplifier 37, the input signal level needs to be at the operation point level, and since a large degree of latitude is allowed for the output level (the output voltage level of the combined signal output terminal CSO) in the case of the signal combining circuit using the current polarity switching circuits 31 to 34, interface matching between the amplifier 37 and the signal combining circuit (current polarity switching circuits 31 to 34) can be easily achieved by using as the voltage level correction circuit 35 a circuit constructed from an amplifier (inverter) whose input and output are shorted together.

Here, when the voltage level correction circuit 35 such as shown in the fifth to ninth embodiments is constructed in a negative feedback configuration, for example, the output of the circuit constructed from an amplifier whose input and output are shorted together should be used as the reference voltage Vr.

Figure 26:
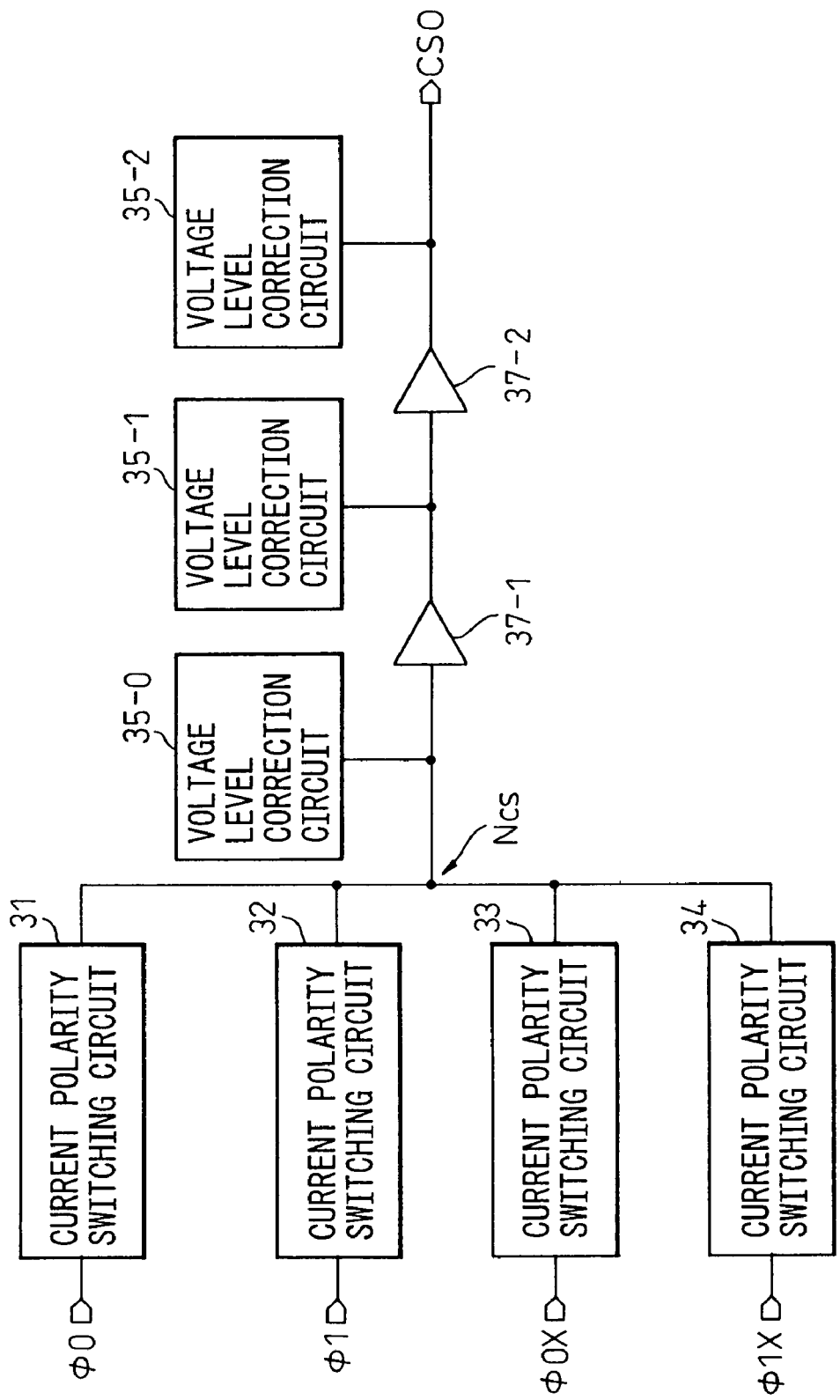
FIG. 26 is a block circuit diagram showing a 12th embodiment of the timing signal generating circuit according to the present invention.

FIG. 26 is a block circuit diagram showing a 12th embodiment of the timing signal generating circuit according to the present invention, and FIGS. 27A, 27B, 28A, and 28B are diagrams for explaining the operation of the timing signal generating circuit of the 12th embodiment shown in FIG. 26.

As is apparent from a comparison between FIG. 26 and FIG. 24, in the timing signal generating circuit of the 12th embodiment, the amplifier 37 in the 11th embodiment is replaced by multiple stages of amplifiers (in FIG. 26, two stages), and voltage level correction circuits 35-1 and 35-2 are provided for the outputs of the respective amplifiers 37-1 and 37-2. It will be appreciated that the number of stages of amplifiers need not be limited to two.

Figure 27A:
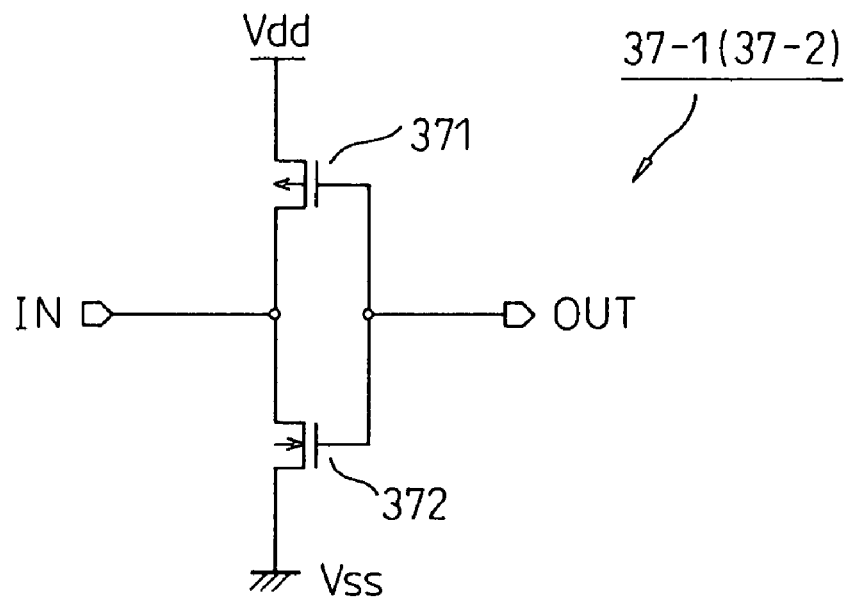
FIGS. 27A and 27B are diagrams (part 1) for explaining the operation of the timing signal generating circuit of the 12th embodiment shown in FIG. 26.

First, referring to FIGS. 27A and 27B, an explanation will be given of the problem that arises when the amplifiers 37-1 and 37-2 are constructed from ordinary inverter circuits. FIG. 27A shows an inverter circuit comprising a pMOS transistor 371 and an nMOS transistor 372, applied as the amplifier 37-1 (37-2), and FIG. 27B is a diagram for explaining the problem that arises when the inverter circuit is applied.

Figure 27B:
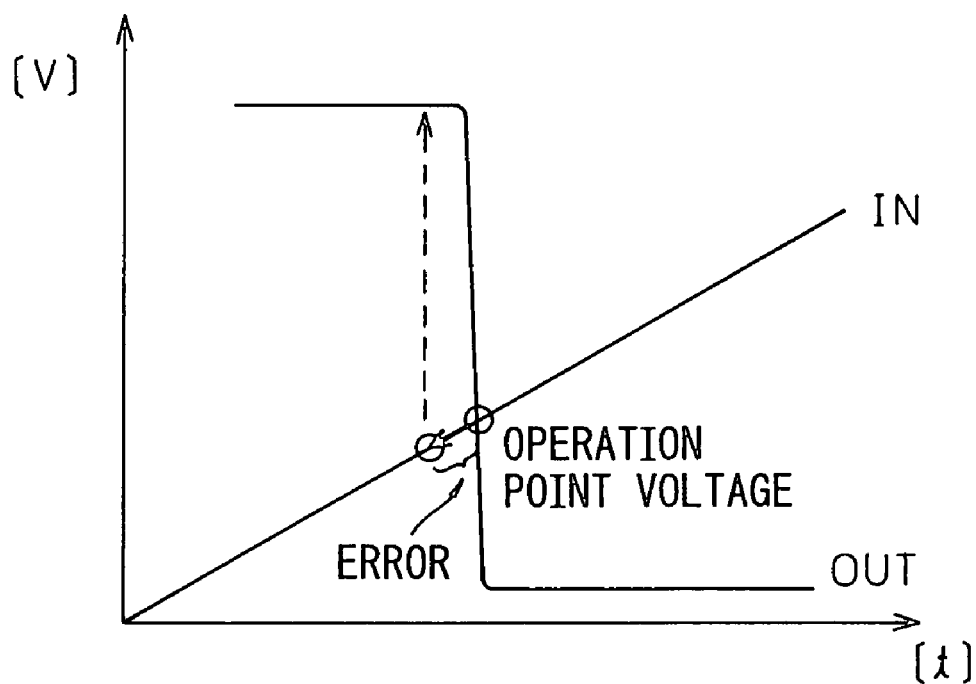

As shown in FIGS. 27A and 27B, when the amplifier 37-1 (37-2) is constructed from an ordinary inverter circuit, since the inverter circuit has a very high DC gain, and the error tolerance range of the operation point voltage is very narrow, no signal will appear at the output if the amplitude of the input voltage is small. That is, when a negative feedback type voltage level correction circuit is used, the voltage level of the phase-combined signal can be obtained with relatively high accuracy, but since an error of 1/(open gain of negative feedback loop) occurs, there is the possibility that the error may go out of the error tolerance range of the operation point voltage.

Figure 28A:
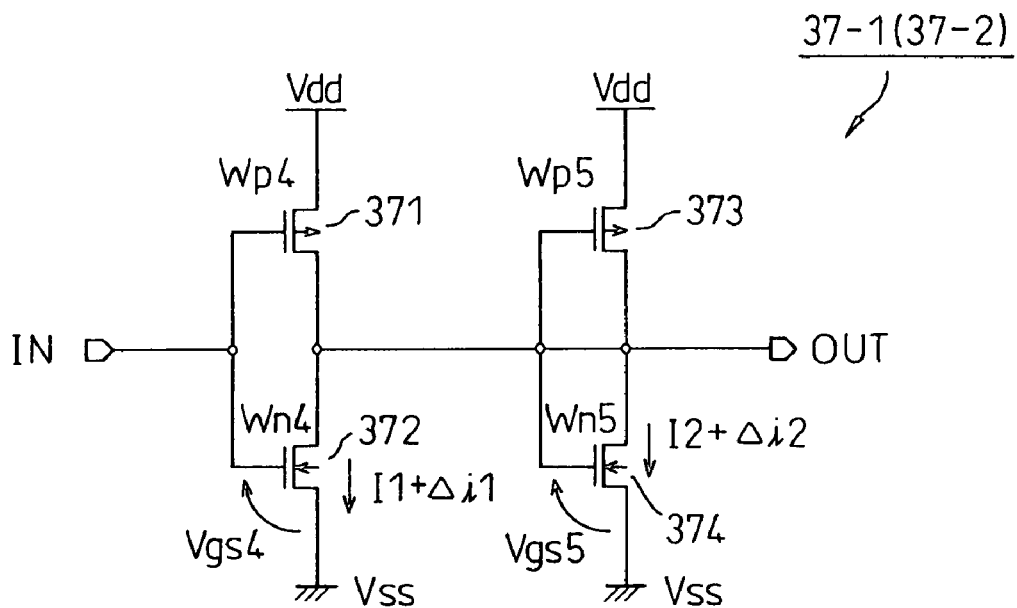
FIGS. 28A and 28B are diagrams (part 2) for explaining the operation of the timing signal generating circuit of the 12th embodiment shown in FIG. 26.

In view of this, in the timing signal generating circuit of the 12th embodiment shown in FIG. 26, multiple stages of low-gain amplifiers 37-1 and 37-2 are provided. As shown in FIG. 28A, each of the amplifiers 37-1 and 37-2 comprises a diode-connected pMOS transistor 373 and a diode-connected nMOS transistor 374, in addition to the pMOS transistor 371 and nMOS transistor 372 forming the inverter circuit. With this configuration, the gains of the amplifiers 37-1 and 37-2 can be reduced.

Next, referring to FIGS. 28A and 28B, the operation in the region near the operation point voltage will be described in relation to the gain reduction of the inverter circuit by specifically dealing with the nMOS transistors. Here, the gate widths of the pMOS transistors 371 and 373 are denoted by Wp4 and Wp5, respectively, and the gate widths of the nMOS transistors 372 and 374 are denoted by Wn4 and Wn5, respectively, while their threshold voltage is denoted by Vth. Further, the currents flowing through the nMOS transistors 372 and 374 are denoted by I1+$\Delta$i1 and I2+$\Delta$i2, respectively, and the gate-source voltages of the nMOS transistors 372 and 374 are denoted by Vgs1 and Vgs2, respectively. In this case, the transconductances, gm1 and gm2, of the nMOS transistors 372 and 374 are expressed by the following equations.

$$gm1 = \Delta i1/\Delta Vgs1$$

$$gm2 = \Delta i2/\Delta Vgs2$$

Here, the currents I1+Δi1 and I2+Δi2 that flow through the respective nMOS transistors 372 and 374 are no more than the currents that flow through the respective pMOS transistors 371 and 373; therefore, when the pMOS transistors 371 and 373 are regarded as constant current sources, the transistors (372 and 374) with the gate widths Wn4 and Wn5 have equal minuscule current changes, that is, Δi1=Δi2. Hence, the relation $$gm1 \cdot \Delta Vgs1 = gm2 \cdot \Delta Vgs2$$

If the gate length (L) is the same, the gain G can be expressed by the following equation.

$$G = Vout/Vin = \Delta Vgs2/\Delta Vgs1$$
$$= gm1/gm2$$
$$= Wn4(Vgs1 - Vth)/Wn5(Vgs2 - Vth)$$

Since only the region near the operation point level is considered here, Vgs1=Vgs2, and hence $$G = Wn4/Wn5$$

which means that the gain is determined by the ratio of the gate widths. Since the same applies to the pMOS transistors 371 and 373, it can be seen that the gain is determined by the ratio of the transistor gate widths.

Figure 28B:
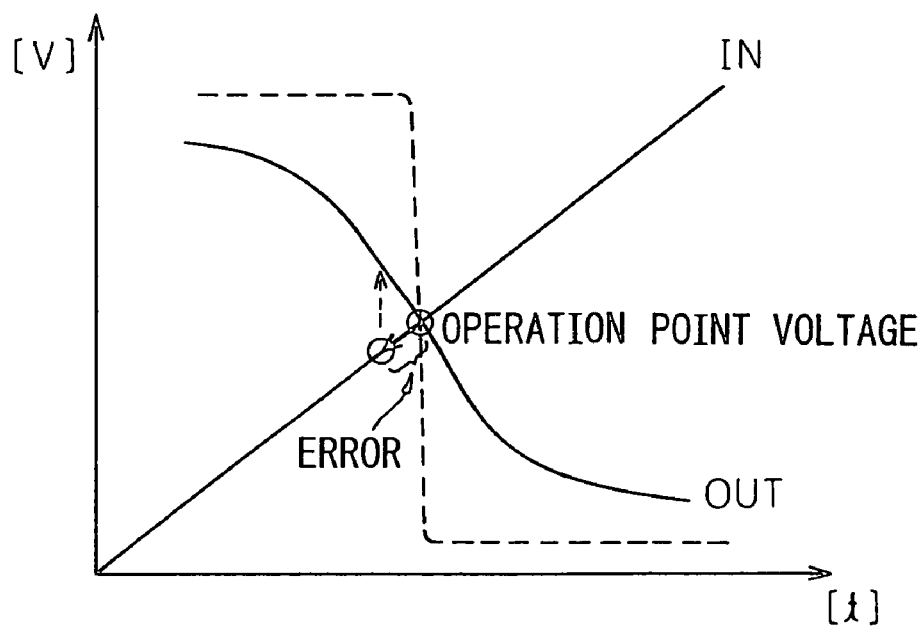

Accordingly, as shown in FIG. 28B, when the gain of the amplifier 37-1 (37-2) is reduced by adjusting the gate width of each transistor, if an error occurs the error does not go out of the error tolerance range of the operation point voltage.

It will also be noted that, in the amplifier 37-1 (37-2) shown in FIG. 28A, the diode-connected transistors 373 and 374 also act to correct the level of the output voltage; therefore, when the circuit configuration shown in FIG. 28A is employed for each of the amplifiers 37-1 and 37-2 in FIG. 26, the output voltage level correction is done for each amplifier output stage, without having to specifically provide the voltage level correction circuits 35-0, 35-1, and 35-2.

Figure 29:
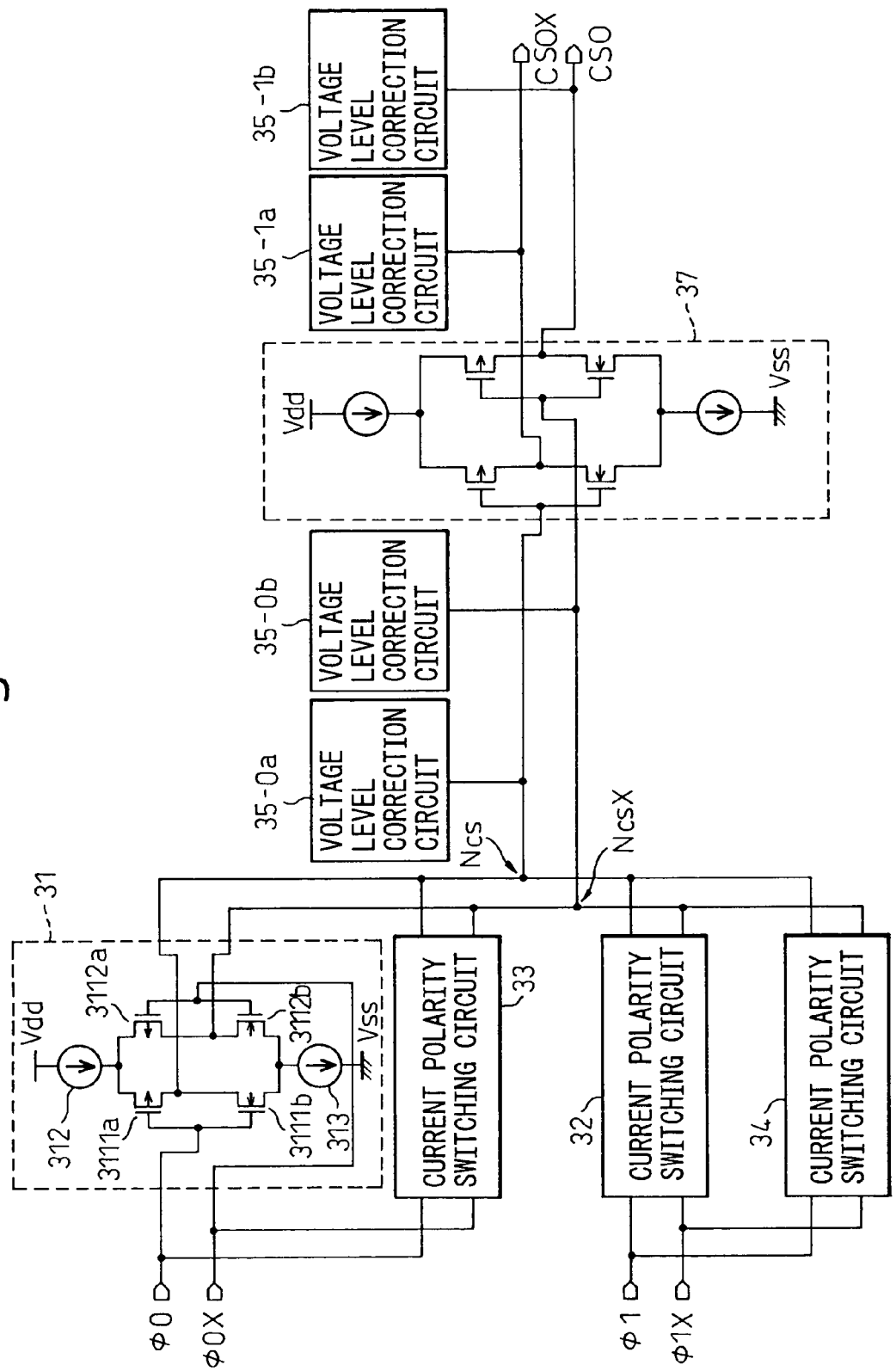
FIG. 29 is a block circuit diagram showing a 13th embodiment of the timing signal generating circuit according to the present invention.

FIG. 29 is a block circuit diagram showing a 13th embodiment of the timing signal generating circuit according to the present invention.

As shown in FIG. 29, in the timing signal generating circuit of the 13th embodiment, the circuit of the previously described fourth embodiment is employed for each of the current polarity switching circuits 31 to 34, and a circuit configuration similar to that of the current polarity switching circuit is applied for the amplifying circuit 37 also. In this embodiment, the voltage level correction circuits 35-0a, 35-0b and 35-1a, 35-1b are provided on both the input and output sides of the amplifying circuit 37.

The timing signal generating circuit of the 13th embodiment has the advantage of facilitating interface matching between the respective circuits because voltage level requirements are less stringent for both the input terminal level and the output terminal level.

Figure 30:
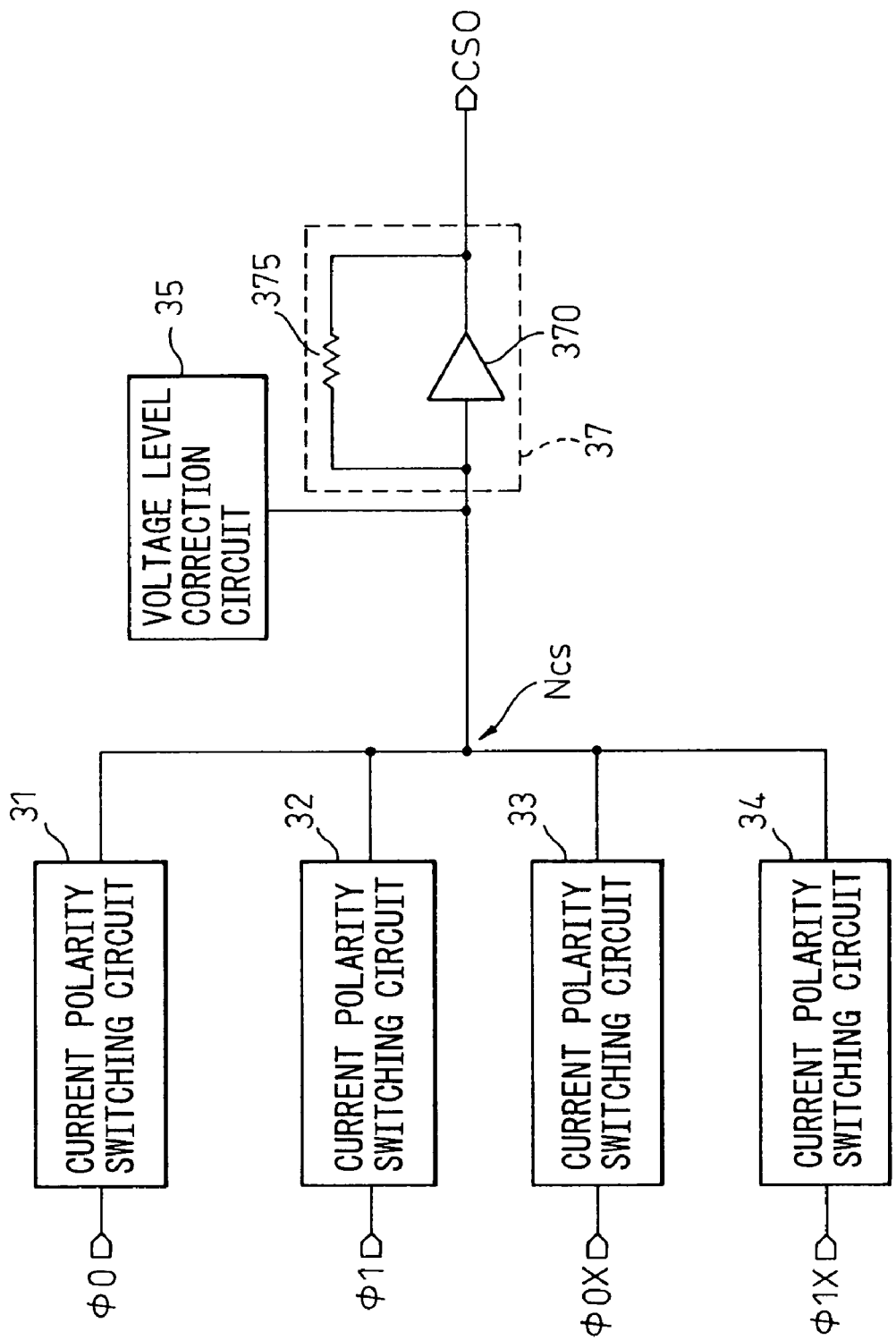
FIG. 30 is a block circuit diagram showing a 14th embodiment of the timing signal generating circuit according to the present invention.

FIG. 30 is a block circuit diagram showing a 14th embodiment of the timing signal generating circuit according to the present invention.

As shown in FIG. 30, in the timing signal generating circuit of the 14th embodiment, the amplifying circuit 37 is configured as a negative feedback type amplifier. More specifically, the amplifying circuit 37 comprises an amplifier 370 having, for example, the circuit configuration shown in FIG. 28A, and a resistive element 375 for negative feedback. By employing such a negative feedback amplifier for the amplifying circuit 37, stable amplification can be easily achieved.

Here, if the input voltage (the voltage at the combined node NCS) to the amplifying circuit 37 is adjusted almost to the operation point level of the amplifying circuit 37 (amplifier 370) by means of the voltage level correction circuit 35, since the feedback action of the amplifier also works to correct the operation point level, a situation where no output is produced can be avoided even when the amplifier gain per stage is raised.

If a non-feedback amplifier is used, the amplitude of the voltage at the combined node Ncs (the combined signal output terminal CSO) may become too large and may exceed the saturation region of the current source transistors; if this happens, generation of the highly accurate intermediate voltage will be adversely affected. By contrast, when the amplifying circuit 37 is configured as a feedback type amplifier, as in the timing signal generating circuit of the 14th embodiment, since the input voltage to the amplifier 370 is reduced to 1/(amplifier gain) of the output voltage, a situation where a great burden is placed on the current source transistors does not easily occur.

Figure 31:
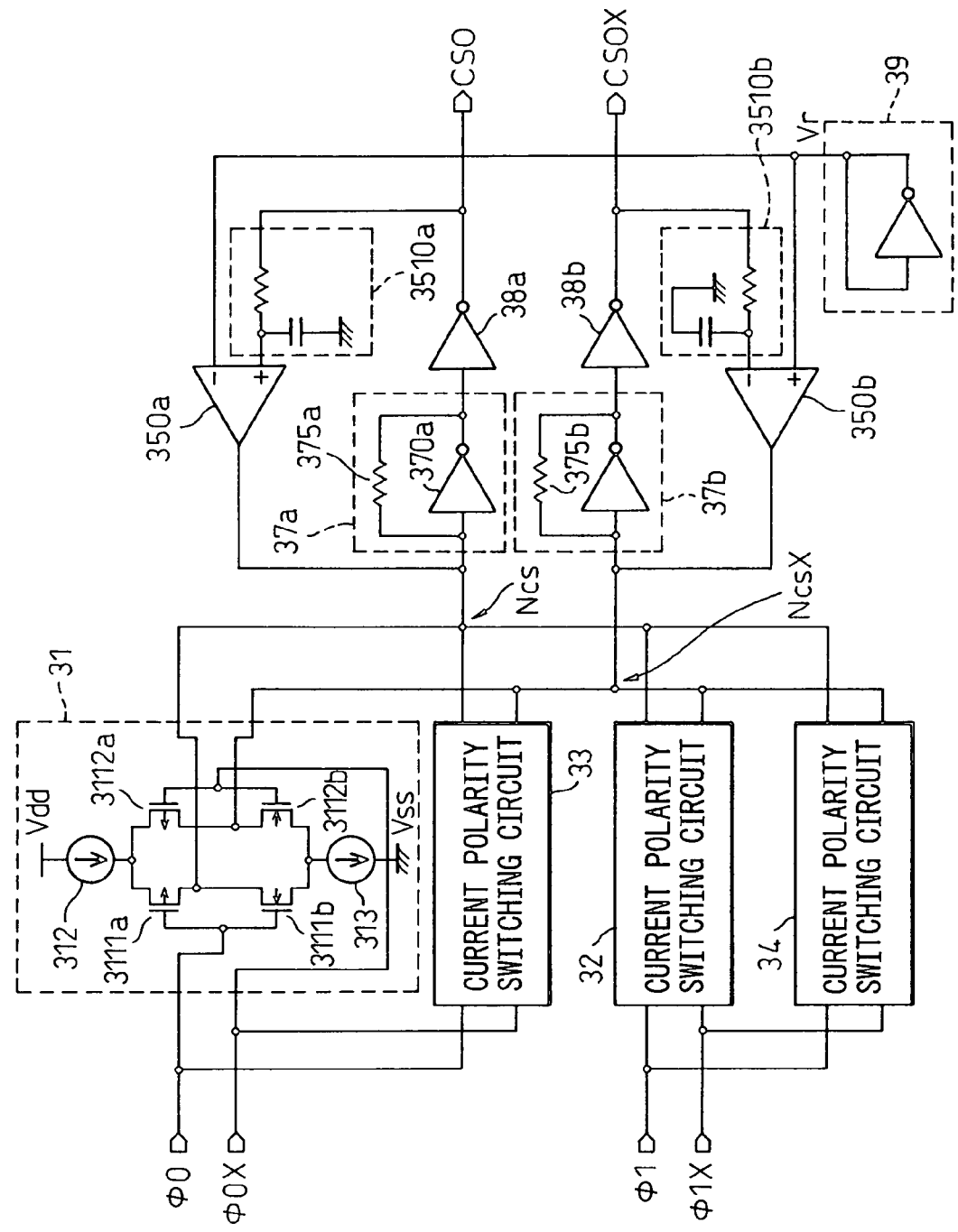
FIG. 31 is a block circuit diagram showing a 15th embodiment of the timing signal generating circuit according to the present invention.

FIG. 31 is a block circuit diagram showing a 15th embodiment of the timing signal generating circuit according to the present invention.

As shown in FIG. 31, in the timing signal generating circuit of the 15th embodiment, the combined nodes Ncs and NcsX are respectively connected to the combined signal output terminals CSO and CSOX via amplifiers 37a and 37b, each similar in configuration to the negative feedback type amplifying circuit (37) shown in the foregoing 14th embodiment, and via inverters 38a and 38b. Further, the outputs of the inverters 38a and 38b (the outputs at the combined signal output terminals CSO and CSOX) are each supplied to one input of a corresponding one of operational amplifiers 350a and 350b via a corresponding one of average value detection circuits 3510a and 3510b each consisting of a resistor and a capacitor, and are compared with the reference voltage Vr supplied to the other input from a reference voltage generating circuit 39; then, the outputs of the operational amplifiers 350a and 350b are fed back to the inputs of the respective amplifying circuits 37a and 37b.

More specifically, the average value detection circuits 3510a and 3510b smooth signal components by cutting off high frequencies and obtain the average value of the signal. The operational amplifiers 350a and 350b operate so as to force the average value voltages obtained from the average value detection circuits 3510a and 3510b to be identical with the operation point level of the reference voltage Vr (amplifiers 370a and 370b) obtained from the reference voltage generating circuit 39, and the voltages settle down to the operation point level of the amplifiers 370a and 370b by the action of such a feedback loop. In the circuit shown in FIG. 31, since the first-stage amplifiers 370a and 370b are configured as feedback amplifiers, and since the inputs to the first-stage amplifiers are at the operation point level of the amplifiers, the first-stage amplifiers 370a and 370b each produce an output signal whose level is centered about the operation point level. Since there is no appreciable error in the operation point level of the first-stage amplifiers 370a and 370b, the second-stage amplifiers 38a and 38b can accomplish high gain amplification. Furthermore, according to the timing signal generating circuit of the 15th embodiment, since the voltage levels are detected using the average value detection circuits 3510a and 3510b, the duty cycle can be corrected at the same time.

In this way, according to the timing signal generating circuit of each embodiment of the present invention, the signal combining circuit outputs a current value that is determined only by its current sources, and stable amplification can be performed even when the amplitude of the voltage at the combined signal output terminal CSO, CSOX is small; as a result, a highly accurate intermediate phase can be produced.

As described in detail above, the timing signal generating circuit (receiver circuit) of the present invention can generate timing signals with high accuracy by using simple circuitry.

Many different embodiments of the present invention may be constructed without departing from the spirit and scope of the present invention, and it should be understood that the present invention is not limited to the specific embodiments described in this specification, except as defined in the appended claims.

What is claimed is:

1. A timing signal generating circuit which receives a plurality of input signals of differing phases and generates a timing signal having a phase intermediate therebetween, comprising:
    a plurality of current polarity switching circuits coupled to the plurality of current polarity switching circuits for, each provided between a plurality of current sources and acting to switch an output current polarity in accordance with a corresponding one of said input signals; and
    a voltage level correction circuit correcting a voltage level of a phase-combined signal produced by combining weighted outputs of said plurality of current polarity switching circuits.

2. The timing signal generating circuit as claimed in claim 1, wherein said voltage level correction circuit is constructed from a negative feedback circuit.

3. The timing signal generating circuit as claimed in claim 1, further comprising an amplifying circuit amplifying said phase-combined signal, and wherein said voltage level correction circuit corrects the voltage level of said phase-combined signal to or near an operation point level of said amplifying circuit.

4. The timing signal generating circuit as claimed in claim 3, wherein said amplifying circuit comprises a plurality of stages of amplifiers in cascade, and said voltage level correction circuit corrects the voltage level for each output of each of said amplifiers.

5. The timing signal generating circuit as claimed in claim 4, wherein said voltage level correction circuit detects an output voltage average value of said timing signals, and corrects the output voltage average value of said timing signals to or near an operation point level of said amplifier.

6. The timing signal generating circuit as claimed in claim 3, wherein said amplifying circuit comprises a negative feedback type amplifier.

7. The timing signal generating circuit as claimed in claim 6, wherein said voltage level correction circuit detects an output voltage average value of said timing signals, and corrects the output voltage average value of said timing signals to or near an operation point level of said amplifier.

8. The timing signal generating circuit as claimed in claim 1, wherein said timing signal generating circuit generates differential timing signals, and wherein said voltage level correction circuit comprises:
    a voltage level monitoring circuit monitoring the voltage level of said differential timing signals; and
    a center voltage controlling circuit controlling the center voltage of said differential timing signals based on a reference voltage and an output of said voltage level monitoring circuit.

9. The timing signal generating circuit as claimed in claim 8, wherein said center voltage controlling circuit directly controls the center voltage of said differential timing signals.

10. The timing signal generating circuit as claimed in claim 8, wherein said center voltage controlling circuit controls the center voltage of said differential timing signals by adjusting a current in each of said current polarity switching circuits.

11. The timing signal generating circuit as claimed in claim 10, wherein said center voltage controlling circuit controls the center voltage of said differential timing signals by adjusting a current that flows through a current correction transistor connected in parallel to a current source in each of said current polarity switching circuits.

12. The timing signal generating circuit as claimed in claim 1, wherein each of said current polarity switching circuits comprises:
    a first current source connected to a first power supply line;
    a second current source connected to a second power supply line; and
    a current polarity switching switch, connected between said first and second current sources, switching current polarity.

13. The timing signal generating circuit as claimed in claim 12, wherein:
    said first power supply line is a high potential power supply line and said second power supply line is a low potential power supply line; and
    said first current source is a sourcing type current source which sources a current from said high potential power supply line toward said current polarity switching switch, and said second current source is a sinking type current source which sinks a current from said current polarity switching switch toward said low potential power supply line.

14. A receiver circuit coupled to the plurality of current polarity switching circuits for comprising:
    a data detection/discrimination circuit detecting and discriminating data carried in an input signal;
    a changing point detection/discrimination circuit detecting and discriminating a changing point appearing in said input signal;
    a phase comparator circuit receiving outputs from said data detection/discrimination circuit and said changing point detection/discrimination circuit, and comparing the phases of said outputs; and
    a clock signal generating circuit receiving an output from said phase comparator circuit, and supplying a first internal clock to said data detection/discrimination circuit and a second internal clock to said changing point detection/discrimination circuit, wherein
    said clock signal generating circuit is a timing signal generating circuit which receives a plurality of input signals of differing phases and generates a timing signal having a phase intermediate therebetween, comprising:

a plurality of current polarity switching circuits, each provided between a plurality of current sources and acting to switch an output current polarity in accordance with a corresponding one of said input signals; and a voltage level correction circuit correcting a voltage level of a phase-combined signal produced by combining weighted outputs of said plurality of current polarity switching circuits.

15. The receiver circuit as claimed in claim 14, wherein said voltage level correction circuit is constructed from a negative feedback circuit.

16. The receiver circuit as claimed in claim 14, wherein said timing signal generating circuit further comprises an amplifying circuit amplifying said phase-combined signal, and wherein said voltage level correction circuit corrects the voltage level of said phase-combined signal to or near an operation point level of said amplifying circuit.

17. The receiver circuit as claimed in claim 16, wherein said amplifying circuit comprises a plurality of stages of amplifiers in cascade, and said voltage level correction circuit corrects the voltage level for each output of each of said amplifiers.

18. The receiver circuit as claimed in claim 17, wherein said voltage level correction circuit detects an output voltage average value of said timing signals, and corrects the output voltage average value of said timing signals to or near an operation point level of said amplifier.

19. The receiver circuit as claimed in claim 16, wherein said amplifying circuit comprises a negative feedback type amplifier.

20. The receiver circuit as claimed in claim 19, wherein said voltage level correction circuit detects an output voltage average value of said timing signals, and corrects the output voltage average value of said timing signals to or near an operation point level of said amplifier.

21. The receiver circuit as claimed in claim 14, wherein said timing signal generating circuit generates differential timing signals, and wherein said voltage level correction circuit comprises:

a voltage level monitoring circuit monitoring the voltage level of said differential timing signals; and a center voltage controlling circuit controlling the center voltage of said differential timing signals based on a reference voltage and an output of said voltage level monitoring circuit.

22. The receiver circuit as claimed in claim 21, wherein said center voltage controlling circuit directly controls the center voltage of said differential timing signals.

23. The receiver circuit as claimed in claim 21, wherein said center voltage controlling circuit controls the center voltage of said differential timing signals by adjusting a current in each of said current polarity switching circuits.

24. The receiver circuit as claimed in claim 23, wherein said center voltage controlling circuit controls the center voltage of said differential timing signals by adjusting a current that flows through a current correction transistor connected in parallel to a current source in each of said current polarity switching circuits.

25. The receiver circuit as claimed in claim 14, wherein each of said current polarity switching circuits comprises:

a first current source connected to a first power supply line;

a second current source connected to a second power supply line; and a current polarity switching switch, connected between said first and second current sources, switching current polarity.

26. The receiver circuit as claimed in claim 25, wherein:

said first power supply line is a high potential power supply line and said second power supply line is a low potential power supply line; and said first current source is a sourcing type current source which sources a current from said high potential power supply line toward said current polarity switching switch, and said second current source is a sinking type current source which sinks a current from said current polarity switching switch toward said low potential power supply line.

* * * * *